US012672414B2

(12) United States Patent
Ahn

(10) Patent No.: US 12,672,414 B2
(45) Date of Patent: Jun. 30, 2026

(54) DISPLAY DEVICE AND MANUFACTURING METHOD FOR THE SAME

(71) Applicant: Samsung Display Co., LTD., Yongin-si (KR)

(72) Inventor: Ho Kyun Ahn, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 581 days.

(21) Appl. No.: 18/113,742

(22) Filed: Feb. 24, 2023

(65) Prior Publication Data

US 2023/0335698 A1 Oct. 19, 2023

(30) Foreign Application Priority Data

Apr. 19, 2022 (KR) ......................... 10-2022-0048311

(51) Int. Cl.
*H10H 29/14* (2025.01)
*H10H 20/01* (2025.01)
*H10H 20/83* (2025.01)

(52) U.S. Cl.
CPC ........ *H10H 29/142* (2025.01); *H10H 20/032* (2025.01); *H10H 20/83* (2025.01); *H10H 20/0364* (2025.01)

(58) Field of Classification Search
CPC .. H10H 20/032; H10H 20/0364; H10H 20/83; H10H 20/857; H10H 29/142; H01L 25/0753; H01L 25/167; H10K 71/861
See application file for complete search history.

(56) References Cited

U.S. PATENT DOCUMENTS

| | | | | |
|---|---|---|---|---|
| 11,908,848 B2 * | 2/2024 | Lee | ....................... | H01L 25/167 |
| 12,446,371 B2 * | 10/2025 | Im | ....................... | H01L 25/0753 |
| 2022/0077227 A1 * | 3/2022 | Kang | .................. | H01L 25/0753 |
| 2022/0302235 A1 * | 9/2022 | Kim | ..................... | H10H 20/857 |
| 2022/0302354 A1 * | 9/2022 | Kim | .................... | H01L 25/0753 |

FOREIGN PATENT DOCUMENTS

| | | | | |
|---|---|---|---|---|
| KR | 20200085977 A | * | 7/2020 | ........... H10H 29/142 |
| KR | 10-2021-0132259 A | | 11/2021 | |
| KR | 10-2021-0150631 A | | 12/2021 | |

* cited by examiner

*Primary Examiner* — Christine S. Kim
*Assistant Examiner* — Tien Tran
(74) *Attorney, Agent, or Firm* — Womble Bond Dickinson (US) LLP

(57) ABSTRACT

A display device includes: alignment electrodes on a base layer, the electrodes including a first electrode and a second electrode; a light emitting element disposed on the alignment electrodes; a first conductive connection pattern layer including a first connection electrode electrically connected to the light emitting element, at least a portion of the first conductive pattern layer disposed on the alignment electrodes; and a second conductive connection pattern layer including a second connection electrode electrically connected to the light emitting element and a conductive pattern layer disposed on the first conductive connection pattern layer, at least a portion of the second conductive connection pattern layer disposed on the alignment electrodes. The conductive pattern layer is electrically connected to the first conductive connection pattern layer.

19 Claims, 28 Drawing Sheets

DR2
DR3 DR1

ALE': ALE1', ALE2', ALE3', ALE4'
LD: LD1, LD2, LD3, LD4
ELT: ELT1, ELT2, ELT3, ELT4, ELT5
CH: CH1, CH2
OPA: OPA1, OPA2
CP: CP1, CP2, CP3, CP4
SP: SP1, SP2, SP3, SP4

LD: LD1, LD2, LD3, LD4
SP: SP1, SP2, SP3, SP4
ELT: ELT1, ELT2, ELT3, ELT4, ELT5

PXL: SPXL1, SPXL2, SPXL3
CCL: CCL1, CCL2, LSL
CFL: CF1, CF2, CF3

ALE': ALE1', ALE2', ALE3', ALE4'
LD: LD1, LD2, LD3, LD4
ELT: ELT1, ELT2, ELT3, ELT4, ELT5
CH: CH1, CH2
OPA: OPA1, OPA2
CP: CP1, CP2, CP3, CP4
SP: SP1, SP2, SP3, SP4

ALE1      ALE2   ALE3      ALE4

BNK1

INS1

INP      INP      INP

PCL(BSL)

A                     A'

ALE: ALE1, ALE2, ALE3, ALE4

ALE1   EP1   EP2   ALE2   ALE3   EP2   EP1   ALE4

BNK1

INS1

PCL(BSL)

INP        LD        INP        LD        INP
          (LD1)               (LD4)

A                                                    A'

ALE: ALE1, ALE2, ALE3, ALE4

INS1

PCL(BSL)    INP    ALE1    LD(LD2)    ALE2    INP

DR3    C    C'

ALE: ALE1, ALE2, ALE3, ALE4

DISPLAY DEVICE AND MANUFACTURING METHOD FOR THE SAME

CROSS-REFERENCE TO RELATED APPLICATION(S)

The application claims priority to and benefits of Korean Patent Application No. 10-2022-0048311 under 35 U.S.C. § 119, filed on Apr. 19, 2022, in the Korean Intellectual Property Office (KIPO), the entire contents of which are incorporated herein by reference.

BACKGROUND

1. Technical Field

Embodiments relate to a display device and a manufacturing method for the display device.

2. Description of the Related Art

Recently, as interest in information displays is increased, research and development of display devices have been continuously conducted.

SUMMARY

Embodiments provide a display device and a method of manufacturing the display device of capable of improving the reliability of a repair process such that light emitting elements may be normally operated.

In an embodiment, A display device may include: alignment electrodes disposed on a base layer, the alignment electrodes spaced apart from each other; a light emitting element disposed on the alignment electrodes; a first conductive connection pattern layer including a first connection electrode electrically connected to the light emitting element, at least a portion of the first conductive connection pattern layer disposed on the alignment electrodes; and a second conductive connection pattern layer including a second connection electrode electrically connected to the light emitting element and a conductive pattern layer disposed on the first conductive connection pattern layer, at least a portion of the second conductive connection pattern layer disposed on the alignment electrodes, wherein the conductive pattern layer may be electrically connected to the first conductive connection pattern layer.

The display device may further include: serial parts including a first serial part and a second serial part that are electrically connected to each other, each of the first serial part and the second serial part including the light emitting element; and a first power source and a second power source that supply different power sources to the serial parts. The serial parts may be electrically connected between the first power source and the second power source. The first conductive connection pattern layer may further include a third connection electrode. The light emitting element of the first serial part may electrically connect the first connection electrode and a first portion of the second connection electrode to each other, and the light emitting element of the second serial part may electrically connect a second portion of the second connection electrode and the third connection electrode to each other.

The conductive pattern layer and the second conductive connection pattern layer may include a same material, and the conductive pattern layer and the first conductive connection pattern layer may be disposed on different layers, respectively.

The conductive pattern layer may be included in each of the serial parts.

The conductive pattern layer may be disposed at a higher level than the first conductive connection pattern layer, with respect to the base layer.

The second conductive connection pattern layer may include a bridge connecting a first portion of the second connection electrode included in the first serial part, and a second portion of the second connection electrode included in the second serial part. The conductive pattern layer may include a first conductive pattern layer included in the first serial part and a second conductive pattern layer in the second serial part. The first conductive pattern layer may be adjacent to a first side of the bridge, and the second conductive pattern layer may be adjacent to a second side of the bridge.

The alignment electrodes may be spaced apart from each other in a first direction. The first conductive pattern layer and the second conductive pattern layer may not overlap the light emitting element in the first direction.

The conductive pattern layer may be electrically connected to the first conductive pattern layer, which overlaps the conductive pattern layer in a plan view, through a contact part penetrating an insulating layer between the conductive pattern layer and the first conductive connection pattern layer.

The display device may further include: serial parts including a first serial part and a second serial part that are electrically connected to each other; a first power source and a second power source that supply different power sources to the serial parts; and a repair conductive pattern layer included in the second serial part, wherein the serial parts may be electrically connected between the first power source and the second power source. The conductive pattern layer may include a first conductive pattern layer included in the first serial part and a second conductive pattern layer included in the second serial part. The first conductive connection pattern layer may further include a third connection electrode. The light emitting element of the first serial part may electrically connect the first connection electrode and a first portion of the second connection electrode to each other. The repair conductive pattern layer may electrically connect a second portion of the second connection electrode and the second conductive pattern layer to each other in the second serial part.

The repair conductive pattern layer may overlap the second conductive pattern layer in a plan view.

The light emitting element may not electrically connect the second connection electrode and the third connection electrode in the second serial part.

The repair conductive pattern layer may include a conductive ink.

The display device may further include a first serial part, a second serial part, a third serial part, and a fourth serial part that are electrically connected to each other, each of the first serial part, the second serial part, the third serial part, and the fourth serial part including the light emitting element. The first conductive connection pattern layer may further include a third connection electrode and a fifth connection electrode. The second conductive connection pattern layer may further include a fourth connection electrode. The light emitting element may include a first light emitting element included in the first serial part, a second light emitting element in the second serial part, a third light emitting element in the third serial part, and a fourth light emitting element in the fourth serial part. The first connection electrode, the first light emitting element, the second connection electrode, the second light emitting element, the third connection electrode, the third light emitting element, the fourth connection electrode, the fourth light emitting element, and the fifth connection electrode may be sequentially electrically connected to each other.

In an embodiment, a method for manufacturing a display device may include: disposing alignment electrodes on a base layer; disposing a light emitting element on the alignment electrodes in serial parts on the base layer; disposing a first conductive connection pattern layer on the base layer; disposing a second conductive connection pattern layer on the base layer; and performing a repair process on the serial parts, wherein the disposing of the second conductive connection pattern layer may include disposing a conductive pattern layer on at least a portion of the first conductive connection pattern layer, wherein each of the first conductive connection pattern layer and the second conductive connection pattern layer may include connection electrodes spaced apart from each other with an area in which the light emitting element is disposed in each of the serial parts, wherein the serial parts include a first serial part and a second serial part, and wherein the performing of the repair process may include: determining whether the connection electrode of the first conductive connection pattern layer and the connection electrode of the second conductive connection pattern layer are electrically connected to each other in each of the serial parts; and disposing a repair conductive pattern layer on the conductive pattern layer in the second serial part in which the connection electrode of the first conductive connection pattern layer and the connection electrode of the second conductive connection pattern layer are not electrically connected to each other.

Each of the connection electrodes may include: a first connection electrode included in the first serial part and a third connection electrode including at least a portion in the second serial part, wherein the first connection electrode and the third connection electrode included in the first conductive connection pattern layer; and a second connection electrode including a first portion included in the first serial part and a second portion in the second serial part, wherein the second connection electrode included in the second conductive connection pattern layer. The disposing of the second conductive connection pattern layer may be performed after the disposing of the first conductive connection pattern layer.

The determining whether the connection electrode of the first conductive connection pattern layer and the connection electrode of the second conductive connection pattern layer are electrically connected to each other may include checking whether the light emitting element electrically connects the connection electrodes to each other.

The repair conductive pattern layer may electrically connect a first portion of the second conductive connection pattern layer and a second portion of the second conductive connection pattern layer to each other.

The repair conductive pattern layer may include a conductive ink.

The method may further include disposing an insulating layer between the first conductive connection pattern layer and the second conductive connection pattern layer. The disposing of the insulating layer may include forming a hole exposing at least a portion of the first conductive connection pattern layer in a plan view.

In an embodiment a display device may include a first serial part and a second serial part, electrically connected between a first power source and a second power source, wherein the first serial part may include a first connection electrode, a first light emitting element, a first conductive pattern layer, and a first part of a second connection electrode, wherein the second serial part may include a second conductive pattern layer, a second part of the second connection electrode, a third connection electrode, and a repair conductive pattern layer disposed on the second conductive pattern layer, wherein the first connection electrode and the third connection electrode are formed of a same material, wherein the second connection electrode, the first conductive pattern layer, and the second conductive pattern layer are formed of a same material, and wherein the repair conductive pattern layer electrically connects the second connection electrode and the second conductive pattern layer to each other.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein.

FIG. 2 is a schematic sectional view illustrating the light emitting element of FIG. 1.

FIG. 4 is a circuit diagram of an equivalent circuit of a pixel in accordance with an embodiment.

FIGS. 17 to 26 and 28 are schematic process sectional views illustrating a manufacturing method for the display device in accordance with an embodiment.

DETAILED DESCRIPTION OF THE EMBODIMENTS

Figure 1:
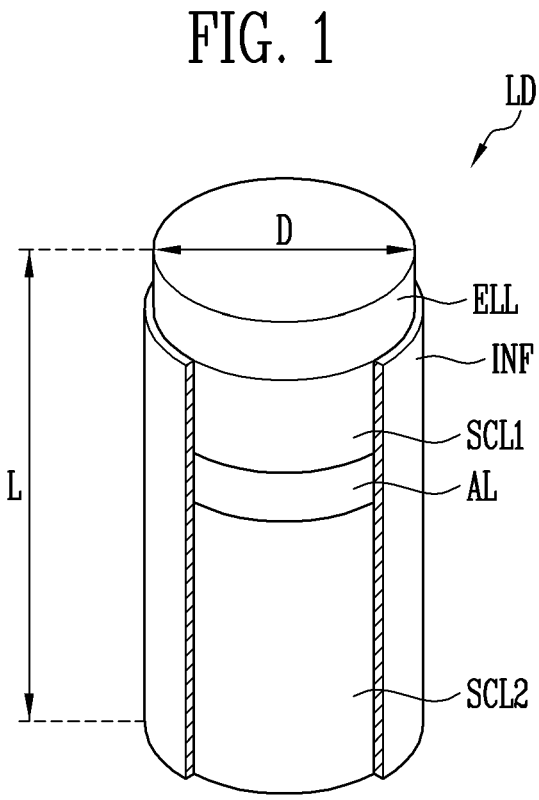
FIG. 1 is a schematic perspective view illustrating a light emitting element in accordance with an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements. Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

The disclosure generally relates to a display device and a manufacturing method for the same. Hereinafter, a display device and a manufacturing method for a same in accordance with an embodiment will be described with reference to the accompanying drawings.

Figure 2:
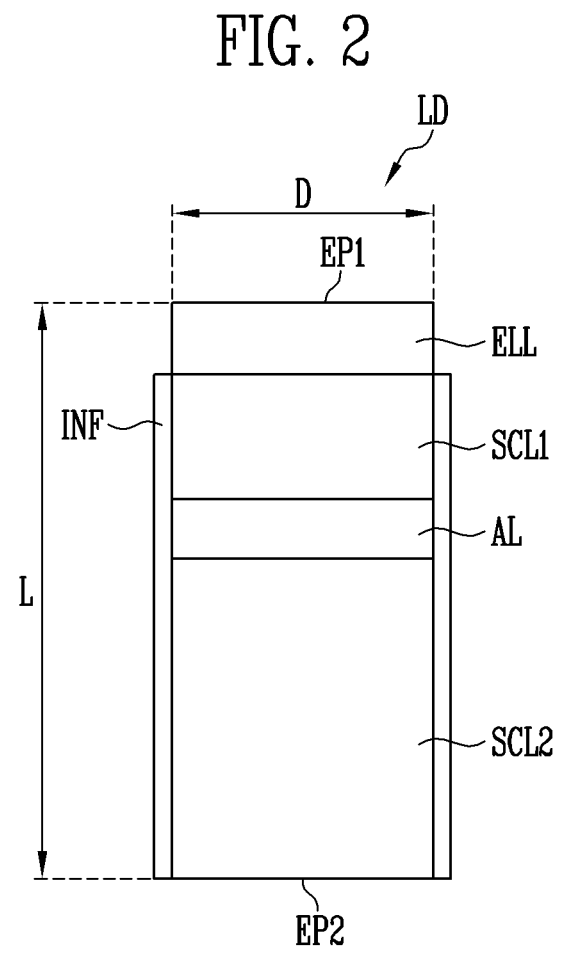

A light emitting element LD in accordance with an embodiment will be described with reference to FIGS. 1 and 2. FIG. 1 is a schematic perspective view illustrating a light emitting element in accordance with an embodiment. FIG. 2 is a schematic sectional view illustrating the light emitting element of FIG. 1.

In accordance with an embodiment, the light emitting element LD may emit light. For example, the light emitting element LD may be a light emitting diode including an inorganic material.

The light emitting element LD may have various shapes. For example, the light emitting element LD may have a shape extending in a direction. In one or more embodiments, the light emitting element LD may have pillar shape as illustrated in FIGS. 1 and 2. However, the kind and shape of the light emitting element LD is not limited to the above-described example.

The light emitting element LD may include a first semiconductor layer SCL1, a second semiconductor layer SCL2, and an active layer AL disposed between the first and second semiconductor layers SCL1 and SCL2. For example, assuming that an extending direction of the light emitting element LD is a length L direction, the light emitting element LD may include the first semiconductor layer SCL1, the active layer AL, and the second semiconductor layer SCL2, which are sequentially stacked along the length L direction. The light emitting element LD may further include an electrode layer ELL and an element insulative film INF.

The light emitting element LD may be formed in a pillar shape extending along a direction. The light emitting element LD may have a first end portion EP1 and a second end portion EP2. The first semiconductor layer SCL1 may be adjacent to the first end portion EP1, and the second semiconductor layer SCL2 may be adjacent to the second end portion EP2. The electrode layer ELL may be adjacent to the first end portion EP1 of the light emitting element LD.

The light emitting element LD may be a light emitting element manufactured in a pillar shape by an etching process, or the like. The term "pillar shape" may include a rod-like shape or a bar-like shape, which is long in the length L direction (i.e., its aspect ratio is greater than 1), such as a cylinder or a polyprism, and the shape of its section is not limited thereto. For example, a length L of the light emitting element LD may be greater than a diameter D (or a width of a cross-section) of the light emitting element LD.

The light emitting element LD may have a size of nanometer scale to micrometer scale. For example, the light emitting element LD may have a diameter D (or width) in a range of nanometer scale to micrometer scale and/or a length L in a range of nanometer scale to micrometer scale. However, the size of the light emitting element LD is not limited thereto.

The first semiconductor layer SCL1 may be a first conductivity type semiconductor layer. The first semiconductor layer SCL1 may be disposed on the active layer AL, and may include a semiconductor layer having a type different from a type of the second semiconductor layer SCL2. For example, the first semiconductor layer SCL1 may include a P-type semiconductor layer. In an example, the first semiconductor layer SCL1 may include at least one semiconductor material among InAlGaN, GaN, AlGaN, InGaN, AlN, and InN, and include a P-type semiconductor layer doped with a first conductivity type dopant such as Mg. However, the material constituting the first semiconductor layer SCL1 is not limited thereto. For example, the first semiconductor layer SCL1 may be formed of various materials.

The active layer AL may be disposed between the first semiconductor layer SCL1 and the second semiconductor layer SCL2, and have a single-quantum well structure or a multi-quantum well structure. The position of the active layer AL is not limited to a specific example, and may be variously changed according to the kind of the light emitting element LD.

A clad layer doped with a conductive dopant may be formed on the top and/or the bottom of the active layer AL. For example, the clad layer may be formed as an AlGaN layer or an InAlGaN layer. In one or more embodiments, a material such as AlGaN or AlInGaN may be used to form the active layer AL. For example, the active layer AL may be formed of various materials.

The second semiconductor layer SCL2 may be a second conductivity type semiconductor layer. The second semiconductor layer SCL2 may be disposed on the active layer AL, and may include a semiconductor layer having a type different from the type of the first semiconductor layer SCL1. For example, the second semiconductor layer SCL2 may include an N-type semiconductor layer. For example, the second semiconductor layer SCL2 may include any one semiconductor material among InAlGaN, GaN, AlGaN, InGaN, AlN, and InN, and include an N-type semiconductor layer doped with a second conductivity type dopant such as Si, Ge or Sn. However, the material constituting the second semiconductor layer SCL2 is not limited thereto. For example, the second semiconductor layer SCL2 may be formed of various materials.

In case that a voltage which is a threshold voltage or more is applied to ends (e.g., opposite ends) of the light emitting element LD, the light emitting element LD may emit light by the combination of electron-hole pairs in the active layer AL. The light emission of the light emitting element LD may be controlled by using such a principle, so that the light emitting element LD may be used as a light source for various light emitting devices, including a pixel of a display device.

The element insulative film INF may be disposed on a surface of the light emitting element LD. The element insulative film INF may be formed on the surface of the light emitting element LD to surround an outer circumferential surface of at least the active layer AL. For example, the element insulative film INF may surround areas of the first and second semiconductor layers SCL1 and SCL2. The element insulative film INF may be formed as a single layer or a multi-layer. However, embodiments are not limited thereto, and the element insulative film INF may be formed of layers. For example, the element insulative film INF may include a first insulating layer including a first material and a second insulating layer including a second material different from the first material.

The element insulative film INF may expose the end portions of the light emitting element LD, which have different polarities. For example, the element insulative film INF may expose an end portion of each of the electrode layer ELL and the second semiconductor layer SCL2, which are respectively adjacent to the first and second end portions EP1 and EP2 of the light emitting element LD.

The element insulative film INF may include an insulating material among silicon oxide ($SiO_x$), silicon nitride ($SiN_x$), silicon oxynitride ($SiO_xN_y$), aluminum oxide ($AlO_x$), and titanium oxide ($TiO_x$). The element insulative film INF may have a single-layer structure or a multi-layer structure. However, embodiments are not limited to the above-described example. For example, in accordance with an embodiment, the element insulative film INF may be omitted.

In accordance with an embodiment, in case that the element insulative film INF covers the surface of the light emitting element LD, for example, the outer surface of the active layer AL, the electrical stability of the light emitting element LD may be ensured. In case that the element insulative film INF is disposed on the surface of the light emitting element LD, a surface defect of the light emitting element LD may be minimized, thereby improving the lifetime and efficiency of the light emitting element LD. For example, in case that light emitting elements LD are densely disposed, an unwanted short circuit may be prevented from occurring between the light emitting elements LD.

The electrode layer ELL may be disposed on the first semiconductor layer SCL1. The electrode layer ELL may be adjacent to the first end portion EP1. The electrode layer ELL may be connected (e.g., electrically connected) to the first semiconductor layer SCL1.

A portion of the electrode layer ELL may be exposed. For example, the element insulative film INF may expose a surface of the electrode layer ELL. The electrode layer ELL may be exposed in an area corresponding to the first end portion EP1.

In one or more embodiments, a side surface of the electrode layer ELL may be exposed. For example, the element insulative film INF may not cover at least a portion of the side surface of the electrode layer ELL with covering a side surface of each of the first semiconductor layer SCL1, the active layer AL, and the second semiconductor layer SCL2. Thus, the electrode layer ELL adjacent to the first end portion EP1 may be connected to another component. In one or more embodiments, the insulating layer INF may expose not only the side surface of the electrode layer ELL but also a portion of a side surface of the first semiconductor layer SCL1 and/or the second semiconductor layer SCL2.

In accordance with an embodiment, the electrode layer ELL may be an ohmic contact electrode. However, embodiments are not limited to the above-described example. For example, the electrode layer ELL may be a Schottky contact electrode.

In accordance with an embodiment, the electrode layer ELL may include one of chromium (Cr), titanium (Ti), aluminum (Al), gold (Au), nickel (Ni), and any oxide or ally thereof. However, embodiments are not limited to the above-described example. In one or more embodiments, the electrode layer ELL may be substantially transparent. For example, the electrode layer ELL may include indium tin oxide (ITO). Accordingly, emitted light may be transmitted through the electrode layer ELL.

The structure, shape, and the like of the light emitting element LD are not limited to the above-described example. In one or more embodiments, the light emitting element LD may have various structures and various shapes. For example, the light emitting element LD may further include an additional electrode layer which is disposed on one surface of the second semiconductor layer SCL2 and is adjacent to the second end portion EP2.

Figure 3:
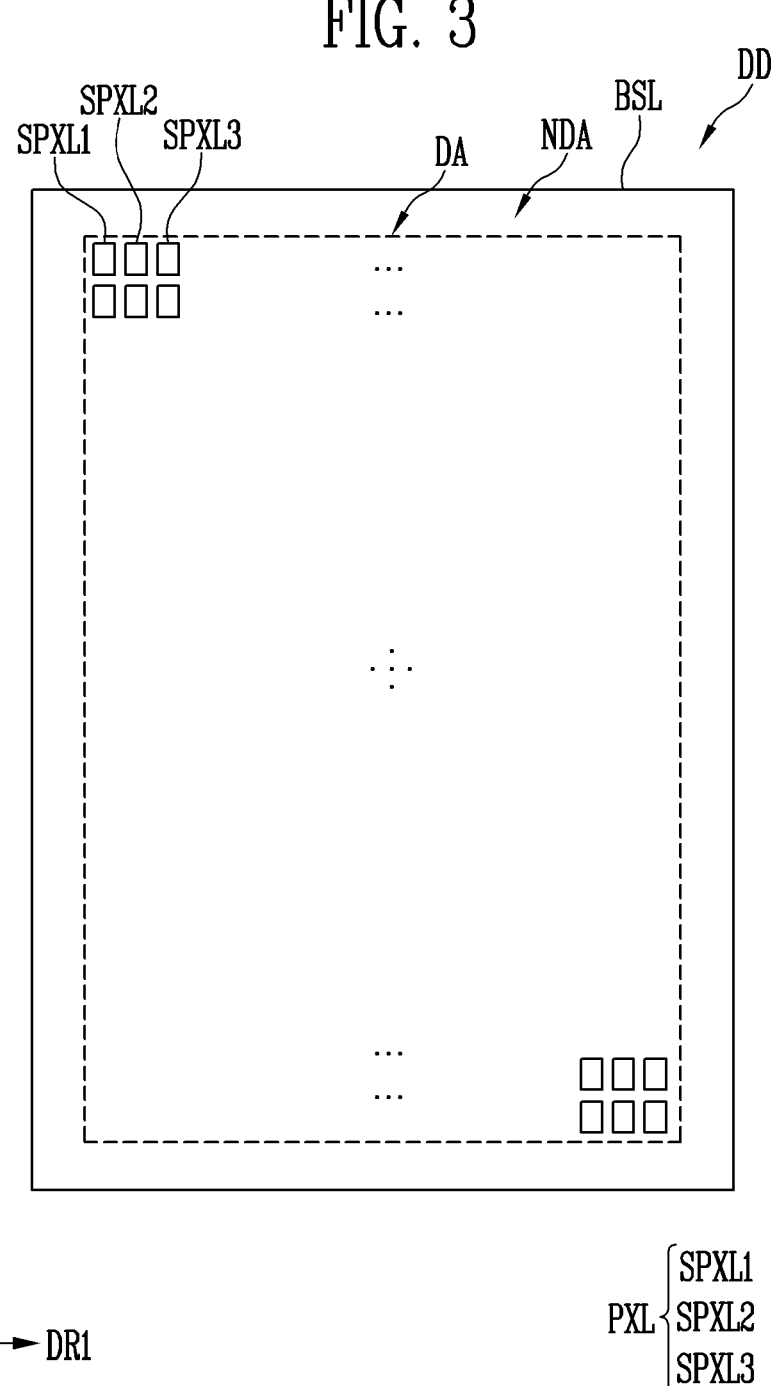
FIG. 3 is a schematic plan view illustrating a display device in accordance with an embodiment.

FIG. 3 is a schematic plan view illustrating a display device in accordance with an embodiment.

Referring to FIG. 3, the display device DD may include a base layer BSL and pixels PXL arranged on the base layer BSL. For example, the display device DD may further include a driving circuit (e.g., a scan driver and a data driver) for driving the pixels PXL, lines, and pads.

The display device DD may include a display area DA and a non-display area NDA. The non-display area NDA means an area except the display area DA. The non-display area NDA may surround at least a portion of the display area DA.

The base layer BSL may form a base member of the display device DD. The base layer BSL may be a rigid substrate, a flexible substrate, or film. For example, the base layer BSL may be a rigid substrate made of glass or tempered glass, a flexible substrate (or thin film) made of a plastic or metal material, or at least one insulating layer. The material and/or property of the base layer BSL is not limited thereto. In an embodiment, the base layer BSL may be substantially transparent. The term "substantially transparent" means that light may be transmitted with a specific transmittance or more. In an embodiment, the base layer BSL may be translucent or opaque. The base layer BSL may include a reflective material in one or more embodiments.

The display area DA may include an area in which the pixels PXL are disposed. The non-display area NDA may include an area in which the pixels PXL are not disposed. The driving circuit, the lines, and the pads, which are connected to the pixels PXL of the display area DA, may be disposed in the non-display area NDA.

In an example, the pixels PXL may be arranged according to a stripe arrangement structure, a PENTILE™ arrangement structure, or the like. However, embodiments are not limited thereto, and various embodiments may be applied to the embodiments.

In accordance with an embodiment, the pixel PXL may include a first sub-pixel SPXL1, a second sub-pixel SPXL2, and a third sub-pixel SPXL3. Each of the first sub-pixel SPXL1, the second sub-pixel SPXL2, and the third sub-pixel SPXL3 may be a sub-pixel. At least one first sub-pixel SPXL1, at least one second sub-pixel SPXL2, and at least one third sub-pixel SPXL3 may constitute a pixel unit capable of emitting lights of various colors.

For example, each of the first sub-pixel SPXL1, the second sub-pixel SPXL2, and the third sub-pixel SPXL3 may emit light of a specific color. For example, the first sub-pixel SPXL1 may be a red pixel emitting light of red (e.g., a first color), the second sub-pixel SPXL2 may be a green pixel emitting light of green (e.g., a second color), and the third sub-pixel SPXL3 may be a blue pixel emitting light of blue (e.g., a third color). In one or more embodiments, the number of second sub-pixels SPXL2 may be greater than the number of first sub-pixels SPXL1 and the number of third sub-pixels SPXL3. However, the color, kind, and/or number of first, second, and third sub-pixels SPXL1, SPXL2, and SPXL3 constituting each pixel unit are not limited to a specific example.

Figure 4:
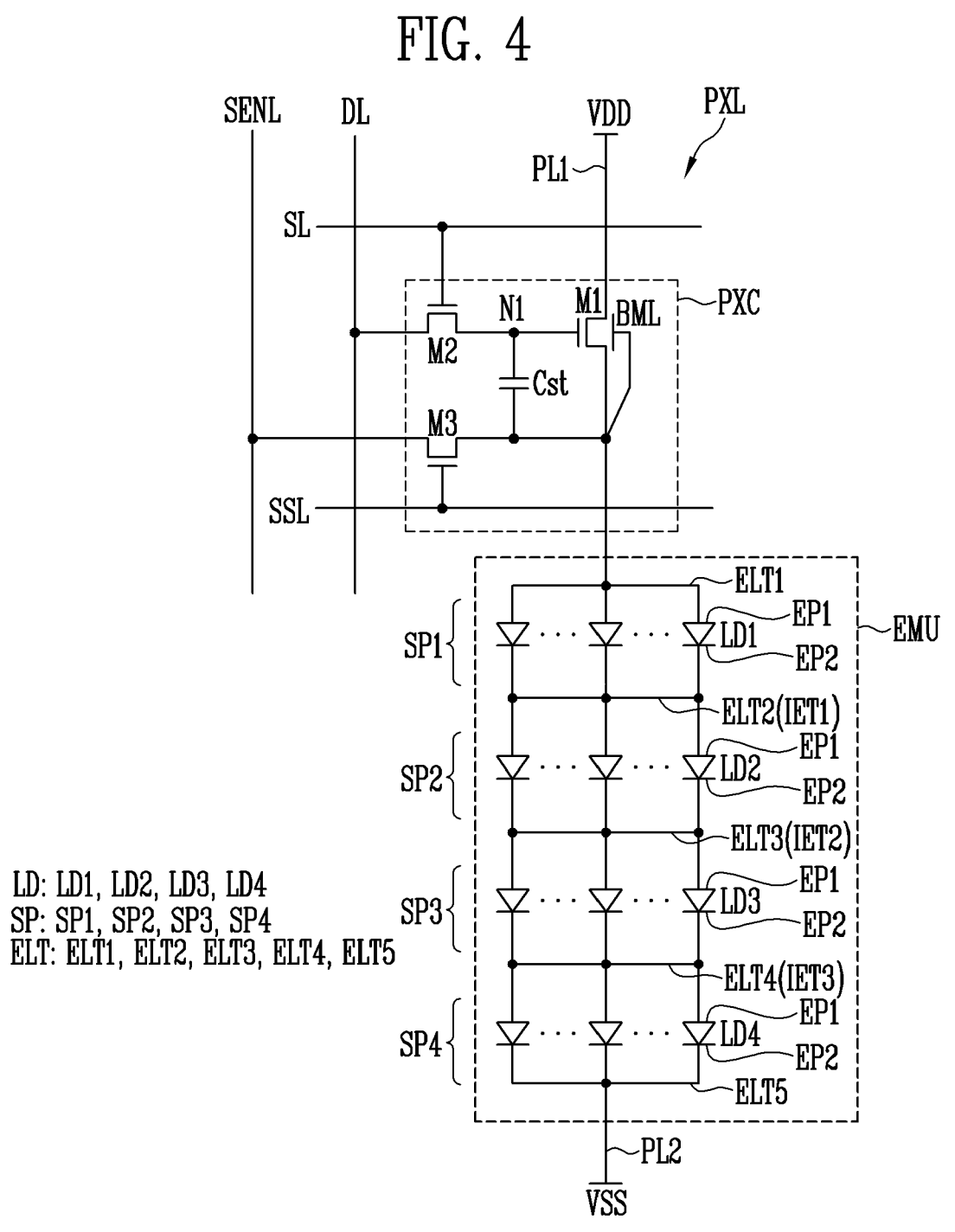

FIG. 4 is a circuit diagram of an equivalent circuit of a pixel in accordance with an embodiment.

In one or more embodiments, the pixel PXL which will be described below may be any one of the first pixel PXL1, the second pixel PXL2, and the third pixel PXL3. The first pixel PXL1, the second pixel PXL2, and the third pixel PXL3 may have structures substantially identical or similar to one another.

Referring to FIG. 4, the pixel PXL may include a light emitting unit EMU for generating light at a luminance corresponding to a data signal and a pixel circuit PXC for driving the light emitting unit EMU.

The pixel circuit PXC may be connected between a first power source VDD and the light emitting unit EMU. The pixel circuit PXC may be connected to a scan line SL and a data line DL of the corresponding pixel PXL to control an operation of the light emitting unit EMU, corresponding to a scan signal and the data signal, which are supplied from the scan line SL and the data line DL. The pixel circuit PXC may be further connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 may be connected (e.g., electrically connected) between the first power source VDD and a first connection electrode ELT1. A gate electrode of the first transistor M1 may be connected (e.g., electrically connected) to a first node N1. The first transistor M1 may control a driving current supplied to the light emitting unit EMU, corresponding to a voltage of the first node N1. For example, the first transistor M1 may be a driving transistor for controlling the driving current of the pixel PXL.

In an embodiment, the first transistor M1 may selectively include a lower conductive layer BML. The gate electrode of the first transistor M1 and the lower conductive layer BML of the first transistor M1 may overlap each other with an insulating layer (e.g., a buffer layer BFL in FIG. 7) interposed therebetween. In an embodiment, the lower conductive layer BML may be connected (e.g., electrically connected) to an electrode, e.g., a source electrode or a drain electrode of the first transistor M1.

In case that the first transistor M1 includes the lower conductive layer BML, a back-biasing technique (or sync technique) may be applied to move a threshold voltage of the first transistor M1 in a negative direction or a positive direction by applying a back-biasing voltage to the lower conductive layer BML of the first transistor M1 during driving of the pixel PXL. In an example, a source-sync technique may be applied by connecting the lower conductive layer BML to a source electrode of the first transistor M1, so that the threshold voltage of the first transistor M1 may be moved in the negative direction or positive direction. For example, in case that the lower conductive layer BML is disposed on the bottom of a semiconductor pattern layer constituting a channel of the first transistor M1, the lower conductive layer BML may function as a light blocking pattern layer, thereby stabilizing operational characteristics of the first transistor M1. However, the function and/or application method of the lower conductive layer BML is not limited thereto.

The second transistor M2 may be connected (e.g., electrically connected) between the data line DL and the first node N1. For example, a gate electrode of the second transistor M2 may be connected (e.g., electrically connected) to the scan line SL. The second transistor M2 may be turned on in case that a scan signal having a gate-on voltage (e.g., a high level voltage) is supplied from the scan line SL to connect (e.g., electrically connect) the data line DL and the first node N1 to each other.

A data signal of a corresponding frame may be supplied to the data line DL for each frame period. The data signal may be transferred to the first node N1 through the turned-on second transistor M2 during a period in which the scan signal having the gate-on voltage is supplied. For example, the second transistor M2 may be a switching transistor for transferring each data signal to the inside of the pixel PXL.

An electrode of the storage capacitor Cst may be connected (e.g., electrically connected) to the first node N1, and another electrode of the storage capacitor Cst may be connected (e.g., electrically connected) to a second electrode of the first transistor M1. The storage capacitor Cst may charge a voltage corresponding to the data signal supplied to the first node N1 during each frame period.

The third transistor M3 may be connected (e.g., electrically connected) between the first connection electrode ELT1 (or the second electrode of the first transistor M1) and the sensing line SENL. For example, a gate electrode of the third transistor M3 may be connected (e.g., electrically connected) to the sensing signal line SSL. The third transistor M3 may transfer a voltage value applied to the first connection electrode ELT1 to the sensing line SENL according to a sensing signal supplied to the sensing signal line SSL. The voltage value transferred through the sensing line SENL may be provided to an external circuit (e.g., a timing controller), and the external circuit may extract characteristic information (e.g., the threshold voltage of the first transistor M1, etc.), based on the provided voltage value. The extracted characteristic information may be used to convert image data such that a characteristic deviation between the pixels PXL may be compensated.

Although a case, where the transistors included in the pixel circuit PXC are all implemented with an n-type transistor, is illustrated in FIG. 4, embodiments are not limited thereto. For example, at least one of the first, second, and third transistors M1, M2, and M3 may be changed to a p-type transistor.

For example, the structure and driving method of the pixel PXL may be variously changed in one or more embodiments. For example, the pixel circuit PXC may be formed as a pixel circuit having various structures and/or various driving methods, in addition to the embodiment shown in FIG. 4.

The light emitting unit EMU may include at least one light emitting element LD connected between the first power source VDD and a second power source VSS. For example, the light emitting unit EMU may include the first connection electrode ELT1 connected to the first power source VDD through the pixel circuit PXC and a first power line PL1, a fifth connection electrode ELT5 connected to the second power source VSS through a second power line PL2, and light emitting elements LD connected between the first and fifth connection electrodes ELT1 and ELT5.

The first power source VDD and the second power source VSS may have different potentials such that the light emitting elements LD may emit light. In an example, the first power source VDD may be set as a high-potential power source, and the second power source VSS may be set as a low-potential power source.

In an embodiment, the light emitting unit EMU may include serial parts SP. Each of the serial parts SP may include a pair of connection electrodes ELT (see FIG. 4) and at least one light emitting element LD connected in a direction between the pair of connection electrodes ELT. The number of light emitting elements LD forming each of the serial parts SP is not limited thereto. In an example, numbers of light emitting elements forming the serial parts SP may be a same or be different from each other. However, the numbers of the light emitting elements LD are not limited thereto. In one or more embodiments, in any one or more of the serial parts SP, light emitting elements LD may not connect (e.g., electrically connect) connection electrodes ELT. A repair process may be performed such that a repair conductive pattern layer RCP (see FIG. 14) may connect (e.g., electrically connect) connection electrodes ELT of a corresponding serial part SP. This will be described in detail below.

The serial parts SP may be formed in plurality. For example, the serial parts SP may include first to fourth serial parts SP1, SP2, SP3, and SP4. However, the number of serial parts for forming the serial parts SP is not limited thereto. Hereinafter, for convenience of description, an embodiment in which the serial parts SP include four serial parts, i.e., the first to fourth serial parts SP1, SP2, SP3, and SP4 will be described.

In accordance with an embodiment, the light emitting unit EMU may include a first serial part SP1 including at least one first light emitting element LD1, a second serial part SP2 including at least one second light emitting element LD2, a third serial part SP3 including at least one third light emitting element LD3, and a fourth serial part SP4 including at least one fourth light emitting element LD4.

The first serial part SP1 may include the first connection electrode ELT1, a second connection electrode ELT2, and at least one first light emitting element LD1 connected between the first and second connection electrodes ELT1 and ELT2. Each first light emitting element LD1 may be connected in the forward-bias direction between the first and second connection electrodes ELT1 and EL2. For example, a first end portion EP1 of the first light emitting element LD1 may be connected to the first connection electrode ELT1, and a second end portion EP2 of the first light emitting element LD1 may be connected to the second connection electrode ELT2.

The second serial part SP2 may include the second connection electrode ELT2 and a third connection electrode ELT3, and at least one second light emitting elements LD2 connected between the second and third connection electrodes ELT2 and ELT3. Each second light emitting element LD2 may be connected in the forward-bias direction between the second and third connection electrodes ELT2 and ELT3. For example, a first end portion EP1 of the second light emitting element LD2 may be connected to the second connection electrode ELT2, and a second end portion EP2 of the second light emitting element LD2 may be connected to the third connection electrode ELT3.

The third serial part SP3 may include the third connection electrode ELT3 and a fourth connection electrode ELT4, and at least one third light emitting elements LD3 connected between the third and fourth connection electrodes ELT3 and ELT4. Each third light emitting element LD3 may be connected in the forward-bias direction between the third and fourth connection electrodes ELT3 and ELT4. For example, a first end portion EP1 of the third light emitting element LD3 may be connected to the third connection electrode ELT3, and a second end portion EP2 of the third light emitting element LD3 may be connected to the fourth connection electrode ELT4.

The fourth serial part SP4 may include the fourth connection electrode ELT4 and the fifth connection electrode ELT5, and at least one fourth light emitting elements LD4 connected between the fourth and fifth connection electrodes ELT4 and ELT5. Each fourth light emitting element LD4 may be connected in the forward-bias direction between the fourth and fifth connection electrodes ELT4 and ELT5. For example, a first end portion EP1 of the fourth light emitting element LD4 may be connected to the fourth connection electrode ELT4, and a second end portion EP2 of the fourth light emitting element LD4 may be connected to the fifth connection electrode ELT5.

A first electrode (e.g., the first connection electrode ELT1) of the light emitting unit EMU may be an anode electrode of the light emitting unit EMU. A last electrode (e.g., the fifth connection electrode ELT5) of the light emitting unit EMU may be a cathode electrode of the light emitting unit EMU.

The other electrodes (e.g., the second connection electrode ELT2, the third connection electrode ELT3, and/or the fourth connection electrode ELT4) of the light emitting unit EMU may constitute respective intermediate electrodes. For example, the second connection electrode ELT2 may constitute a first intermediate electrode IET1, the third connection electrode ELT3 may constitute a second intermediate electrode IET2, and the fourth connection electrode ELT4 may constitute a third intermediate electrode IET3.

In case that light emitting elements LD are connected in a series/parallel structure, power efficiency may be improved as compared with the case that light emitting elements LD of which number is equal to that of the above-described light emitting elements LD are connected only in parallel. For example, in the pixel in which the light emitting elements LD are connected in the series/parallel structure, although a short defect or the like occurs in some serial parts SP, a specific luminance may be expressed through light emitting elements LD of the other serial parts SP. Hence, the probability that a dark spot defect will occur in the pixel PXL may be reduced. However, embodiments are not limited thereto, and the light emitting unit EMU may be formed by connecting the light emitting elements LD only in series or by connecting the light emitting elements LD only in parallel.

Each of the light emitting element LD may include a first end portion EP1 (e.g., a p-type end portion) connected to the first power source VDD via at least one electrode (e.g., the first connection electrode ELT1), the pixel circuit PXC, and/or the first power line PL1, and a second end portion EP2 (e.g., an n-type end portion) connected to the second power source VSS via at least another electrode (e.g., the fifth connection electrode ELT5) and the second power line PL2. For example, the light emitting elements LD may be connected in the forward-bias direction between the first power source VDD and the second power source VSS. The light emitting elements LD connected in the forward-bias direction may constitute effective light sources of the light emitting unit EMU.

In case that a driving current is supplied through the corresponding pixel circuit PXC, the light emitting elements LD may emit light at a luminance corresponding to the driving current. For example, during each frame period, the pixel circuit PXC may supply, to the light emitting unit EMU, a driving current corresponding to a grayscale value to be expressed in a corresponding frame. Accordingly, in case that the light emitting elements LD emit light at the luminance corresponding to the driving current, the light emitting unit EMU may express the luminance corresponding to the driving current.

For example, a pixel PXL in accordance with an embodiment will be described with reference to FIGS. 5 to 11. In FIGS. 5 to 11, redundant descriptions above will be omitted or will not be repeated for descriptive convenience.

Figure 5:
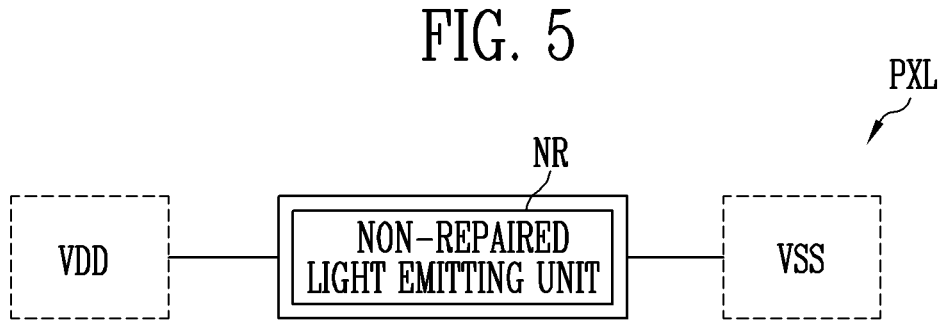
FIG. 5 is a schematic block diagram illustrating a non-repaired light emitting unit of a pixel in accordance with an embodiment.

FIG. 5 is a schematic block diagram illustrating a non-repaired light emitting unit of a pixel in accordance with an embodiment.

Referring to FIG. 5, the pixel PXL may include non-repaired light emitting unit NR. For example, the pixel PX may include serial parts SP each including light emitting elements LD as described above. Each of the serial parts SP may include a conductive pattern layer CP (see FIG. 6) provided to perform a repair process. In one or more embodiments, in case that a process for manufacturing the display device DD is performed, it may be determined whether light emitting elements LD have been normally disposed (or arranged) in each of the serial parts SP. In case that it is determined that the light emitting elements LD of each of the serial parts SP normally connect connection electrodes ELT (e.g., electrically) to each other since the light emitting elements LD are normally disposed (i.e., in case that the serial parts SP are normally connected to each other), the repair process may not be performed on the serial parts SP. Accordingly, the non-repaired light emitting unit NR may include a conductive pattern layer CP preliminarily provided for the purpose of the repair process. The non-repaired light emitting unit NR may not include any repair conductive pattern layer RCP formed by the repair process. The non-repaired light emitting unit NR may correspond to each serial part SP on which the repair process is not performed in the light emitting unit EMU.

In accordance with an embodiment, the non-repaired light emitting unit NR may be connected (e.g., electrically connected) between the first power source VDD and the second power source VSS. Although the repair process is not performed, light emitting elements LD included in the serial parts SP of the non-repaired light emitting unit NR may be normally disposed and may be normally operated.

Figure 6:
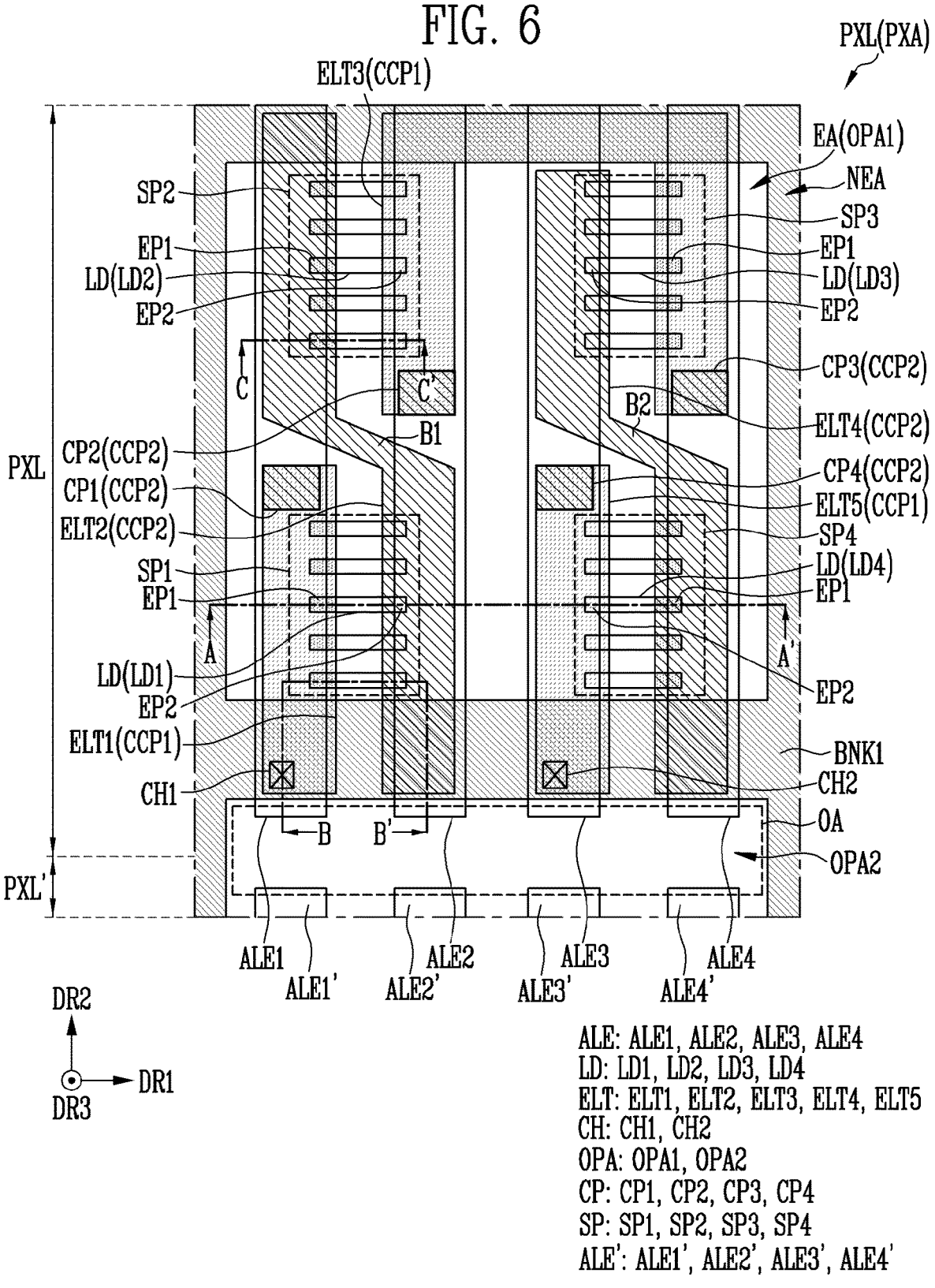
FIG. 6 is a schematic plan view illustrating a pixel in accordance with an embodiment.

FIG. 6 is a schematic plan view illustrating a pixel in accordance with an embodiment.

In an example, FIG. 6 illustrates a pixel area PXA in which a pixel PXL is disposed. The pixel PXL shown in FIG. 6 may be any one of the first to third sub-pixels SPXL1, SPXL2, and SPXL3, and the first to third sub-pixels SPXL1, SPXL2, and SPXL3 may have structures substantially identical or similar to one another. For example, an embodiment in which each pixel PXL includes light emitting elements LD disposed in four serial parts SP1, SP2, SP3, and SP4 as shown in FIG. 4 is disclosed in FIG. 6.

Hereinafter, in case that at least one of first to fourth light emitting elements LD1, LD2, LD3, and LD4 is arbitrarily designated (or mentioned) or in case that two or more kinds of light emitting elements are inclusively designated (or mentioned), the corresponding light emitting element or the corresponding light emitting elements will be referred to as a "light emitting element LD" or "light emitting elements LD." For example, in case that at least one electrode among electrodes including first to fourth electrodes ALE1, ALE2, ALE3, and ALE4 in the form of first to fourth alignment electrodes is arbitrarily designated (or mentioned) or in case that two or more kinds of electrodes are inclusively designated (or mentioned), the corresponding electrode or the corresponding electrodes will be referred to as an "electrode ALE" or "electrodes ALE." In case that at least one connection electrode among connection electrodes including first to fifth connection electrodes ELT1, ELT2, ELT3, ELT4, and ELT5 is arbitrarily designated (or mentioned) or in case that two or more kinds of connection electrodes are inclusively designated (or mentioned), the corresponding connection electrode or the corresponding connection electrodes will be referred to as a "connection electrode ELT" or "connection electrodes ELT."

Referring to FIG. 6, each pixel PXL may include an emission area EA and a non-emission area NEA. The emission area EA may be an area including light emitting elements LD to emit light. The non-emission area NEA may surround the emission area EA. The non-emission area NEA may be an area in which a first bank BNK1 surrounding the emission area EA is disposed. The first bank BNK1 may include a first opening area OPA1 overlapping the emission area EA and a second opening area OPA2 overlapping the non-emission area NEA.

In accordance with an embodiment, the second opening area OPA2 may include an open area OA. For example, the open area OA may be included in the second opening OPA2. The open area OA may include an area including an area in which adjacent electrodes ALE are spaced apart from each other between the adjacent electrodes.

Each pixel PXL may include electrodes ALE, light emitting elements LD, first conductive connection pattern layers CCP1, and second conductive connection pattern layers CCP2. In one or more embodiments, the first conductive connection pattern layer CCP1 may include a first connection electrode ELT1, a third connection electrode ELT3, and a fifth connection electrode ELT5. In one or more embodiments, the second conductive connection pattern layers CCP2 may include a second connection electrode ELT2 and the fourth connection electrode ELT4. In one or more embodiments, the second conductive connection pattern layer CCP2 may further include a conductive pattern layer CP.

The electrodes ALE may be disposed in at least the emission area EA. The electrodes ALE may extend along a second direction DR2, and be spaced apart from each other along a first direction DR1. The electrodes ALE may extend from the emission area EA to the non-emission area NEA. For example, the electrodes ALE may extend from the emission area EA to the second opening area OPA2. Each of first to fourth electrodes ALE1, ALE2, ALE3, and ALE4 may extend along the second direction DR2, and be spaced apart from each other along the first direction DR1 to be sequentially disposed.

Some of the electrodes ALE may be connected to the pixel circuit PXC and/or a specific power line. For example, the first electrode ALE1 may be connected (e.g., electrically connected) to the pixel circuit PXC and/or the first power line PL1, and the third electrode ALE3 may be connected (e.g., electrically connected) to the second power line PL2.

In one or more embodiments, at least some of the electrodes ALE may be connected (e.g., electrically connected) to some of the first conductive connection pattern layers CCP1 through at least one of contact holes CH. For example, the first electrode ALE1 may be connected (e.g., electrically connected) to the first connection electrode ELT1 through a first contact hole CH1 among the contact holes CH, and the third electrode ALE3 may be connected (e.g., electrically connected) to the fifth connection electrode ELT5 through a second contact hole CH2 among the contact holes CH. The positions of the contact holes CH are not limited thereto.

A pair of electrodes ALE adjacent to each other may be supplied with different signals in a process of aligning the light emitting elements LD. For example, in case that the first to fourth electrodes ALE1, ALE2, ALE3, and ALE4 are sequentially arranged along the first direction DR1 in the emission area EA, the first and second electrodes ALE1 and ALE2 may form a pair to be supplied with different alignment signals, and the third and fourth electrodes ALE3 and ALE4 may form a pair to be supplied with different alignment signals. The alignment signals may have different waveforms, different potentials, and/or different phases. Accordingly, an electric field may be formed between the first and second electrodes ALE1 and ALE2, so that light emitting elements LD may be aligned between the first and second electrodes ALE1 and ALE2. Accordingly, an electric field may be formed between the third and fourth electrodes ALE3 and ALE4, so that light emitting elements LD may be aligned between the third and fourth electrodes ALE3 and ALE4. In one or more embodiments, the first to fourth electrodes ALE1, ALE2, ALE3, and ALE4 may be alignment electrodes.

In accordance with an embodiment, at least some of the electrodes ALE of the pixel PXL may be separated from at least some of electrodes ALE' of another pixel PXL' adjacent to the pixel PXL with the open area OA interposed therebetween. For example, the first electrode ALE1 of the pixel PXL may be spaced apart from a first electrode ALE1' of the another pixel PXL', which is adjacent to the first electrode ALE1 in the second direction DR2. The second electrode ALE2 of the pixel PXL may be spaced apart from a second electrode ALE2' of the another pixel PXL', which is adjacent to the second electrode ALE2 in the second direction DR2. The third electrode ALE3 of the pixel PXL may be spaced apart from a third electrode ALE3' of the another pixel PXL', which is adjacent to the third electrode ALE3 in the second direction DR2. The fourth electrode ALE4 of the pixel PXL may be spaced apart from a fourth electrode ALE4' of the another pixel PXL', which is adjacent to the fourth electrode ALE4 in the second direction DR2.

In accordance with an embodiment, the first electrode ALE1 and the third electrode ALE3 may be separated from the first electrode ALE1' and the third electrode ALE3' of the another adjacent pixel PXL', so that the pixel PXL may be individually (or independently) driven. However, embodiments are not limited to the above-described example.

Each of the light emitting elements LD may be aligned between a pair of electrodes ALE in the emission area EA. Each of the light emitting elements LD may be connected (e.g., electrically connected) between a pair of connection electrodes ELT.

A first light emitting element LD1 may be aligned between the first and second electrodes ALE1 and ALE2. The first light emitting element LD1 may be connected (e.g., electrically connected) between the first and second connection electrodes ELT1 and ELT2. In an example, the first light emitting element LD1 may be aligned in a first area (e.g., an upper end area) of the first and second electrodes ALE1 and ALE2. A first end portion EP1 of the first light emitting element LD1 may be connected (e.g., electrically connected) to the first connection electrode ELT1, and a second end portion EP2 of the first light emitting element LD1 may be connected (e.g., electrically connected) to the second connection electrode ELT2.

A second light emitting element LD2 may be aligned between the first and second electrodes ALE1 and ALE2. The second light emitting element LD2 may be connected (e.g., electrically connected) between the second connection electrode ELT2 and a third connection electrode ELT3. In an example, the second light emitting element LD2 may be aligned in a second area (e.g., a lower end area) of the first and second electrodes ALE1 and ALE2. A first end portion EP1 of the second light emitting element LD2 may be connected (e.g., electrically connected) to the second connection electrode ELT2, and a second end portion EP2 of the second light emitting element LD2 may be connected (e.g., electrically connected) to the third connection electrode ELT3.

A third light emitting element LD3 may be aligned between the third and fourth electrodes ALE3 and ALE4. The third light emitting element LD3 may be connected (e.g., electrically connected) between the third and fourth connection electrodes ELT3 and ELT4. In an example, the third light emitting element LD3 may be aligned in a second area (e.g., a lower end area) of the third and fourth electrodes ALE3 and ALE4. A first end portion EP1 of the third light emitting element LD3 may be connected (e.g., electrically connected) to the third connection electrode ELT3, and a second end portion EP2 of the third light emitting element LD3 may be connected (e.g., electrically connected) to the fourth connection electrode ELT4.

A fourth light emitting element LD4 may be aligned between the third and fourth electrodes ALE3 and ALE4. The fourth light emitting element LD4 may be connected (e.g., electrically connected) between the fourth and fifth connection electrodes ELT4 and ELT5. In an example, the fourth light emitting element LD4 may be aligned in a first area (e.g., an upper end area) of the third and fourth electrodes ALE3 and ALE4. A first end portion EP1 of the fourth light emitting element LD4 may be connected (e.g., electrically connected) to the fourth connection electrode ELT4, and a second end portion EP2 of the fourth light emitting element LD4 may be connected (e.g., electrically connected) to the fifth connection electrode ELT5.

Each of the connection electrodes ELT may be disposed in at least the emission area EA, and may overlap at least one electrode ALE and/or at least one light emitting element LD. For example, each of the connection electrodes ELT may be formed on the electrodes ALE and/or the light emitting elements LD to overlap the electrodes ALE and/or the light emitting elements LD. Therefore, each of the electrodes ELT may be connected (e.g., electrically connected) to the light emitting elements LD.

The first connection electrode ELT1 may be disposed on the first area (e.g., a lower end area) of the first electrode ALE1 and the first end portions EP1 of the first light emitting elements LD1 to be connected (e.g., electrically connected) to the first end portions EP1 of the first light emitting elements LD1.

The second connection electrode ELT2 may be disposed on the first area (e.g., a lower end area) of the second electrode ALE2 and the second end portions EP2 of the first light emitting elements LD1 to be connected (e.g., electrically connected) to the second end portions EP2 of the first light emitting elements LD1. The second connection electrode ELT2 may be disposed on the second area (e.g., an upper end area) of the first electrode ALE1 and the first end portions EP1 of the second light emitting elements LD2 to be connected (e.g., electrically connected) to the first end portions EP1 of the second light emitting elements LD2. For example, the second connection electrode ELT2 may connect (e.g., electrically connect) the second end portions EP2 of the first light emitting elements LD1 and the first end portions EP1 of the second light emitting elements LD2 to each other in the emission area EA. For example, the second connection electrode ELT2 may have a bent shape. For example, the second connection electrode ELT2 may have a structure bent or curved at a boundary between an area in which at least one first light emitting element LD1 is arranged and an area in which at least one second light emitting element LD2 is arranged.

The third connection electrode ELT3 may be disposed on the second area (e.g., an upper end area) of the second electrode ALE2 and the second end portions EP2 of the second light emitting elements LD2 to be connected (e.g., electrically connected) to the second end portions EP2 of the second light emitting elements LD2. The third connection electrode ELT3 may be disposed on the second area (e.g., an upper end area) of the fourth electrode ALE4 and the first end portions EP1 of the third light emitting elements LD3 to be connected (e.g., electrically connected) to the first end portions EP1 of the third light emitting elements LD3. For example, the third connection electrode ELT3 may connect (e.g., electrically connect) the second end portions EP2 of the second light emitting elements LD2 and the first end portions EP1 of the third light emitting elements LD3 to each other in the emission area EA. For example, the third connection electrode ELT3 may have a bent shape. For example, the third connection electrode ELT3 may have a structure bent or curved at a boundary between an area in which at least one second light emitting element LD2 is arranged and an area in which at least one third light emitting element LD3 is arranged.

The fourth connection electrode ELT4 may be disposed on the second area (e.g., an upper end area) of the third electrode ALE3 and the second end portions EP2 of the third light emitting elements LD3 to be connected (e.g., electrically connected) to the second end portions EP2 of the third light emitting elements LD3. The fourth connection electrode ELT4 may be disposed on the first area (e.g., a lower end area) of the fourth electrode ALE4 and the first end portions EP1 of the fourth light emitting elements LD4 to be connected (e.g., electrically connected) to the first end portions EP1 of the fourth light emitting elements LD4. For example, the fourth connection electrode ELT4 may connect (e.g., electrically connect) the second end portions EP2 of the third light emitting elements LD3 and the first end portions EP1 of the fourth light emitting elements LD4 to each other in the emission area EA. For example, the fourth connection electrode ELT4 may have a bent shape. For example, the fourth connection electrode ELT4 may have a structure bent or curved at a boundary between an area in which at least one third light emitting element LD3 is arranged and an area in which at least one fourth light emitting element LD4 is arranged.

The fifth connection electrode ELT5 may be disposed on the first area (e.g., a lower end area) of the third electrode ALE3 and the second end portions EP2 of the fourth light emitting elements LD4 to be connected (e.g., electrically connected) to the second end portions EP2 of the fourth light emitting elements LD4.

In the above-described manner, the light emitting elements LD aligned between the electrodes ALE may be connected in a desired form by using the connection electrodes ELT. For example, the first light emitting elements LD1, the second light emitting elements LD2, the third light emitting elements LD3, and the fourth light emitting elements LD4 may be sequentially connected in series by using the connection electrodes ELT. Accordingly, the electrodes ELT may normally define (or form) an electrical path for operating light emitting elements LD of serial parts SP.

In accordance with an embodiment, in order for the light emitting element LD to emit light, an anode signal may be supplied to the first electrode ALE1, and a cathode signal may be supplied to the third electrode ALE3. The supplied anode signal may be sequentially applied to a first light emitting element LD1 of a first serial part SP1, a second light emitting element LD2 of a second serial part SP2, a third light emitting element LD3 of a third serial part SP3, and a fourth light emitting element LD4 of a fourth serial part SP3. For example, the supplied anode signal may be applied sequentially to the first connection electrode ELT1, the first serial part SP1, the second connection electrode ELT2, the second serial part SP2, the third connection electrode ELT3, the third serial part SP3, the fourth connection electrode ELT4, the fourth serial part SP4, and the fifth connection electrode ELT5.

In accordance with an embodiment, the first to fourth serial parts SP1, SP2, SP3, and SP4 may correspond to the non-repaired light emitting unit NR. Accordingly, the first to fourth serial parts SP1, SP2, SP3, and SP4 may include the conductive pattern layer CP without including any repair conductive pattern layer RCP.

The conductive pattern layer CP may be included in the second conductive connection pattern layers CCP2. For example, the conductive pattern layer CP and a layer included in (or identical to) the second conductive connection pattern layers CCP2 may be patterned (or formed) by a same process. For example, the conductive pattern layer CP and the layer included in (or identical to) the second conductive connection pattern layers CCP2 may include a same material. For example, the conductive pattern layer CP and the second connection electrode ELT2 and the fourth connection electrode ELT4 may be deposited by a same process. For example, the conductive pattern layer CP and the second connection electrode ELT2 and the fourth connection electrode ELT4 may include a same material.

At least one conductive pattern layer CP may be disposed in each of the serial parts SP. The conductive pattern layer CP may include first to fourth conductive pattern layers CP1, CP2, CP3, and CP4. For example, the conductive pattern layer CP may be formed in plurality, and the first to fourth conductive pattern layers CP1, CP2, CP3, and CP4 forming the conductive pattern layer CP may be provided (or formed) in each of the serial parts SP. For example, the first conductive pattern layer CP1 may correspond to the first serial part SP1. The second conductive pattern layer CP2 may correspond to the second serial part SP2. The third conductive pattern layer CP3 may correspond to the third serial part SP3. The fourth conductive pattern layer CP4 may correspond to the fourth serial part SP4.

The conductive pattern layer CP may overlap the first conductive connection pattern layers CCP1 in a plan view. For example, the first conductive pattern layer CP1 may overlap the first connection electrode ELT1 in a plan view. The second conductive pattern layer CP2 may overlap an area of the third connection electrode ELT3 corresponding to the second serial part SP2 in a plan view. The third conductive pattern layer CP3 may overlap an area of the third connection electrode ELT3 corresponding to the third serial part SP3 in a plan view. The fourth conductive pattern layer CP4 may overlap an area of the fifth connection electrode ELT5 corresponding to the fifth serial part SP4 in a plan view.

The conductive pattern layer CP may be patterned later than the first conducive connection pattern layers CCP1 to be disposed in a layer outer (or at a higher level) than the first conductive connection pattern layer CCP1, with respect to the base layer BSL. For example, the conductive pattern layer CP may be disposed on the first conductive connection pattern layers CCP1. The first conductive pattern layer CP1 may be disposed on an area corresponding to the first serial part SP1 of the first connection electrode ELT1. The second conductive pattern layer CP2 may be disposed on an area corresponding to the second serial part SP2 of the third connection electrode ELT3. The third conductive pattern layer CP3 may be disposed on an area corresponding to the third serial part SP3 of the third connection electrode ELT3. The fourth conductive pattern layer CP4 may be disposed on an area corresponding to the fourth serial part SP4 of the fifth connection electrode ELT5.

In accordance with an embodiment, the conductive pattern layer CP may be disposed adjacent to bridges B1 and B2 included in the connection electrodes ELT2 and ELT4 of the second conductive connection pattern layer CCP2. For example, the second connection electrode ELT2 (or the second conductive connection pattern layer CCP2) may include a first bridge B1 connecting an area connected (e.g., electrically connected) to the first light emitting element LD1 of the first serial part SP1 and an area connected (e.g., electrically connected) to the second light emitting element LD2 of the second serial part SP2. The fourth connection electrode ELT4 (or the second conductive connection pattern layer CCP2) may include a second bridge B2 connecting an area connected (e.g., electrically connected) to the third light emitting element LD3 of the third serial part SP3 and an area connected (e.g., electrically connected) to the fourth light emitting element LD4 of the fourth serial part SP4. In one or more embodiments, the first conductive pattern layer CP1 may be disposed adjacent to a side of the first bridge B1, and the second conductive pattern layer CP2 may be disposed adjacent to another side of the first bridge B1. The third conductive pattern layer CP3 may be disposed adjacent to a side of the second bridge B2, and the fourth conductive pattern layer CP4 may be disposed adjacent to another side of the second bridge B2.

In accordance with an embodiment, the conductive pattern layer CP may not overlap the light emitting elements LD in a direction (e.g., the first direction DR1) in which the electrodes ALE are spaced apart from each other. For example, the conductive pattern layer CP may be selectively disposed in a partial area of connection electrodes ELT, in which the light emitting elements LD are not disposed. In one or more embodiments, the conductive pattern layer CP may overlap the bridges B1 and B2 along the first direction DR1, and may not overlap the light emitting elements LD.

In accordance with an embodiment, the conductive pattern layer CP may be connected (e.g., electrically connected) to the first conductive connection pattern layer CCP1, and accordingly, the reliability of a repair process may be substantially improved. This will be described in detail below.

Figure 7:
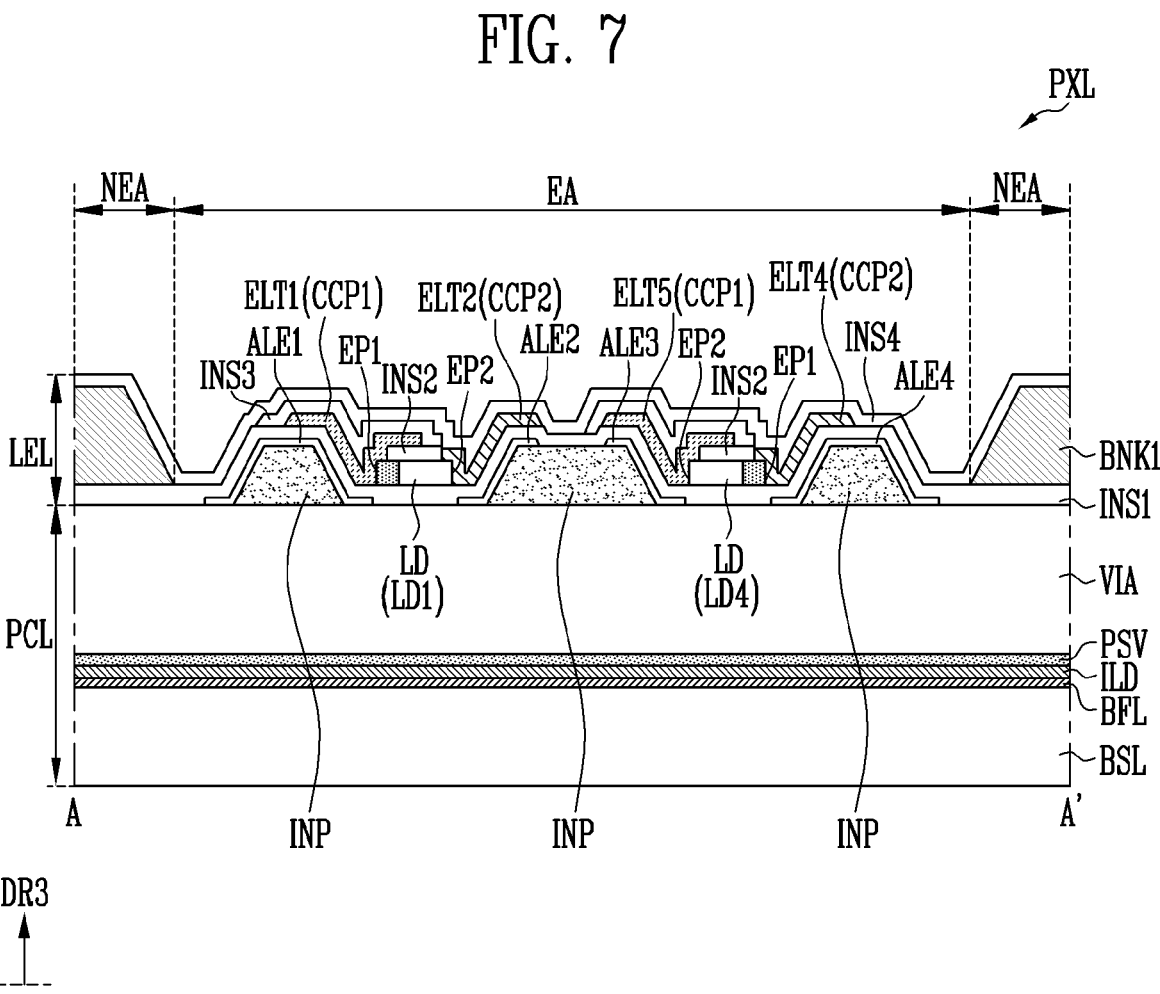
FIG. 7 is a schematic sectional view taken along line A-A' shown in FIG. 6.
Figure 8:
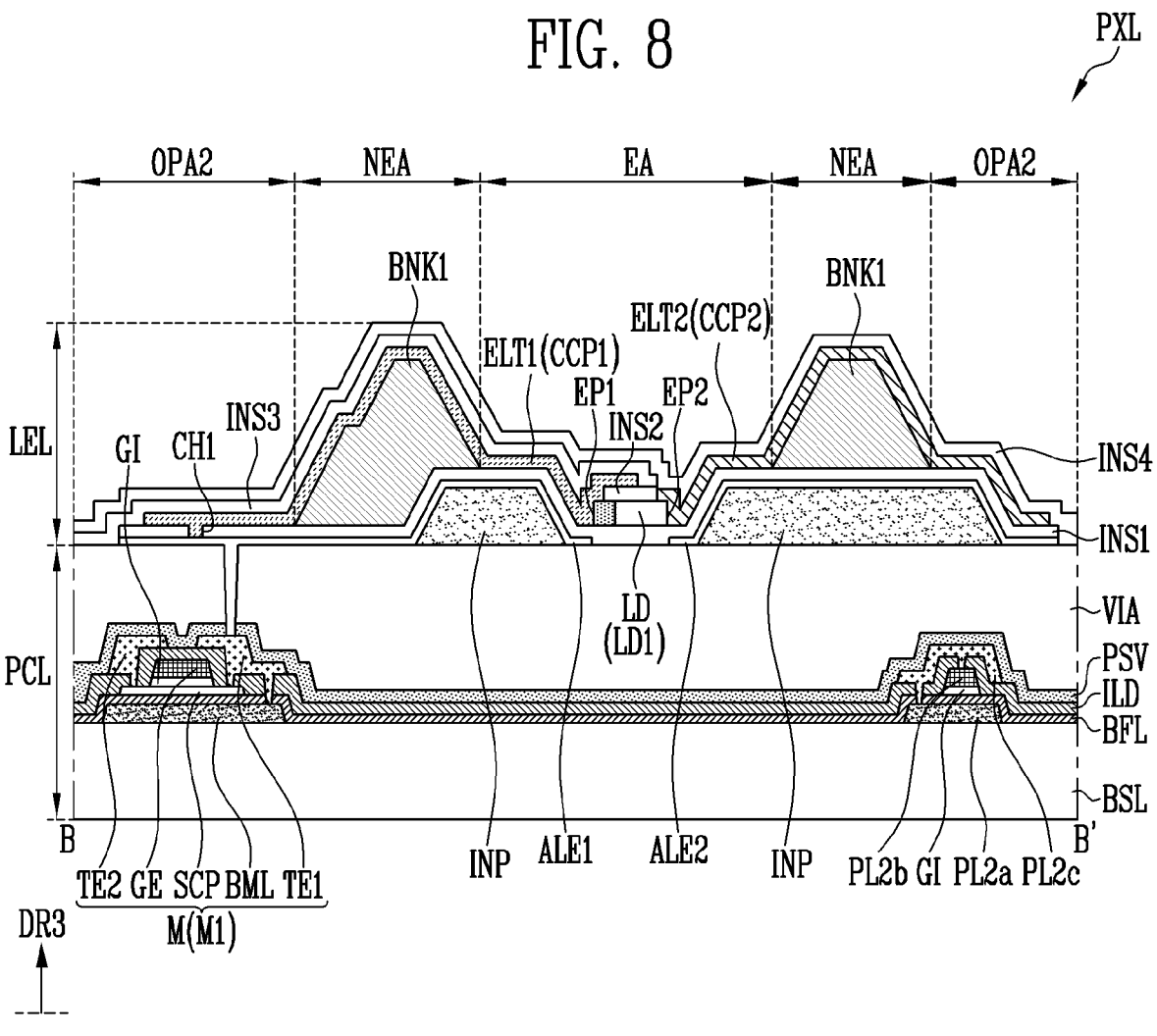
FIG. 8 is a schematic sectional view taken along line B-B' shown in FIG. 6.

Based on a light emitting element LD, a sectional structure of each pixel PXL will be described in detail with reference to FIGS. 7 and 8. FIGS. 7 and 8 illustrate a pixel circuit layer PCL and a light emitting element layer LEL of the pixel PXL. The first transistor M1 among various circuit elements constituting the pixel circuit PXC is illustrated in FIG. 8. In case that the first to third transistors M1, M2, and M3 are designated (or mentioned) without being distinguished from each other, each of the first to third transistors M1, M2, and M3 will be inclusively referred to as a "transistor M." The structure of transistors M and/or the positions of the transistors M for each layer is not limited to the embodiment shown in FIG. 8, and may be variously changed in one or more embodiments. FIG. 7 is a schematic sectional view taken along line A-A' shown in FIG. 6. FIG. 8 is a schematic sectional view taken along line B-B' shown in FIG. 6.

Referring to FIGS. 7 and 8, the pixel circuit layer PCL and the light emitting element layer LEL of the pixel PXL in accordance with the embodiment may include circuit elements including transistors M disposed on a base layer BSL and various lines connected thereto. The light emitting element layer LEL including electrodes ALE, light emitting elements LD, and/or connection electrodes ELT may be disposed on the pixel circuit layer PCL.

The base layer BSL may be a rigid substrate, a flexible substrate, or a film. In an example, the base layer BSL may be a rigid substrate made of glass or tempered glass, a flexible substrate (or thin film) made of a plastic or metal material, or at least one insulating layer. The material and/or property of the base layer BSL is not limited thereto. In an embodiment, the base layer BSL may be substantially transparent. The term "substantially transparent" means that light may be transmitted with a specific transmittance or more. In an embodiment, the base layer BSL may be translucent or opaque. The base layer BSL may include a reflective material in one or more embodiments.

A lower conductive layer BML and a first power conductive layer PL2a may be disposed on the base layer BSL. The lower conductive layer BML and the first power conductive layer PL2a may be disposed in (or formed as) a same layer. For example, the lower conductive layer BML and the first power conductive layer PL2a may be simultaneously formed by a same process, but embodiments are not limited thereto. The first power conductive layer PL2a may constitute the second power line PL2 described with reference to FIG. 4 and the like.

Each of the lower conductive layer BML and the first power conductive layer PL2a may be formed as a single layer or a multi-layer, which is made of at least one of molybdenum (Mo), copper (Cu), aluminum (Al), chromium (Cr), gold (Au), titanium (Ti), nickel (Ni), neodymium (Nd), and indium (In), tin (Sn), and any oxide or ally thereof.

A buffer layer BFL may be disposed over the lower conductive layer BML and the first power conductive layer PL2a. The buffer layer BFL may prevent an impurity from being diffused into each circuit element. The buffer layer BFL may be formed as a single layer, but be formed as a multi-layer including at least two layers. In case that the buffer layer BFL is formed as the multi-layer, the layers may be formed of a same material or be formed of different materials.

A semiconductor pattern layer SCP may be disposed on the buffer layer BFL. In an example, the semiconductor pattern layer SCP may include a first region in contact with a first transistor electrode TE1, a second region in contact with a second transistor electrode ET2, and a channel region disposed between the first and second regions. In one or more embodiments, one of the first and second regions may be a source region, and another of the first and second regions may be a drain region.

In one or more embodiments, the semiconductor pattern layer SCP may be made of poly-silicon, amorphous silicon, oxide semiconductor, etc. For example, the channel region of the semiconductor pattern layer SCP may be a semiconductor pattern layer, which is undoped with an impurity, and may be an intrinsic semiconductor. Each of the first and second regions of the semiconductor pattern layer SCP may be a semiconductor pattern layer, which is doped with a specific impurity.

A gate insulating layer GI may be disposed on the buffer layer BFL and the semiconductor pattern layer SCP. In an example, the gate insulating layer GI may be disposed between the semiconductor pattern layer SCP and a gate electrode GE. The gate insulating layer GI may be disposed between the buffer layer BFL and a second power conductive layer PL2b. The gate insulating layer GI may be formed as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The gate electrode GE of the transistor M and the second power conductive layer PL2b may be disposed on the gate insulating layer GI. For example, the gate electrode GE and the second power conductive layer PL2b may be disposed in (or formed as) a same layer. For example, the gate electrode GE and the second power conductive layer PL2b may be simultaneously formed by a same process, but embodiments are not limited thereto. The gate electrode GE may be disposed on the gate insulating layer GI to overlap the semiconductor pattern layer SCP in a third direction DR3. The second power conductive layer PL2b may be disposed on the gate insulating layer GI to overlap the first power conductive layer PL2a in the third direction DR3. The second power conductive layer PL2b and the first power conductive layer PL2a may constitute the second power line PL2 described with reference to FIG. 4 and the like.

Each of the gate electrode GE and the second power conductive layer PL2b may be formed as a single layer or a multi-layer, which is made of molybdenum (Mo), copper (Cu), aluminum (Al), chromium (Cr), gold (Au), titanium (Ti), nickel (Ni), neodymium (Nd), indium (In), tin (Sn), and any oxide or alloy thereof.

An interlayer insulating layer ILD may be disposed over the gate electrode GE and the second power conductive layer PL2b. In an example, the interlayer insulating layer ILD may be disposed between the gate electrode GE and the first and second transistor electrodes TE1 and TE2. The interlayer insulating layer ILD may be disposed between the second power conductive layer PL2b and a third power conductive layer PL2c.

The interlayer insulating layer ILD may be formed as a single layer or a multi-layer, and include various kinds of inorganic insulating materials, including silicon oxide $(SiO_x)$, silicon nitride $(SiN_x)$, silicon oxynitride $(SiO_xN_y)$, aluminum nitride $(AlN_x)$, aluminum oxide $(AlO_x)$, zirconium oxide $(ZrO_x)$, hafnium oxide $(HfO_x)$, and titanium oxide $(TiO_x)$.

The first and second transistor electrodes TE1 and TE2 of the transistor M and the third power conductive layer PL2c may be disposed on the interlayer insulating layer ILD. The first and second transistor electrodes TE1 and TE2 and the third power conductive layer PL2c may be disposed in (or formed as) a same layer. For example, the first and second transistor electrodes TE1 and TE2 and the third power conductive layer PL2c may be simultaneously formed by a same process, but embodiments are not limited thereto.

The first and second transistor electrodes TE1 and TE2 may overlap the semiconductor pattern layer SCP in the third direction DR3. The first and second transistor electrodes TE1 and TE2 may be connected (e.g., electrically connected) to the semiconductor pattern layer SCP. For example, the first transistor electrode TE1 may be connected (e.g., electrically connected) to the first region of the semiconductor pattern layer SCP through a contact hole penetrating the interlayer insulating layer ILD. The first transistor electrode TE1 may be connected (e.g., electrically connected) to the lower conductive layer BML through a contact hole penetrating the interlayer insulating layer ILD and the buffer layer BFL. The second transistor electrode TE2 may be connected (e.g., electrically connected) to the second region of the semiconductor pattern layer SCP through a contact hole penetrating the interlayer insulating layer ILD. In one or more embodiments, any one of the first and second transistor electrodes TE1 and TE2 may be a source electrode, and another of the first and second transistor electrodes TE1 and TE2 may be a drain electrode.

The third power conductive layer PL2c may overlap the first power conductive layer PL2a and/or the second power conductive layer PL2b in the third direction DR3. The third power conductive layer PL2c may be connected (e.g., electrically connected) to the first power conductive layer PL2a and/or the second power conductive layer PL2b. For example, the third power conductive layer PL2c may be connected (e.g., electrically connected) to the first power conductive layer PL2a through a contact hole penetrating the interlayer insulating layer ILD and the buffer layer BFL. The third power conductive layer PL2c may be connected (e.g., electrically connected) to the second power conductive layer PL2b through a contact hole penetrating the interlayer insulating layer ILD. The third power conductive layer PL2c, the first power conductive layer PL2a, and/or the second power conductive layer PL2b may constitute the second power line PL2 described with reference to FIG. 4 and the like.

The first and second transistor electrodes TE1 and TE2 and the third power conductive layer PL2c may be formed as a single layer or a multi-layer, which is made of molybdenum (Mo), copper (Cu), aluminum (Al), chromium (Cr), gold (Au), titanium (Ti), nickel (Ni), neodymium (Nd), indium (In), tin (Sn), and any oxide or alloy thereof.

A protective layer PSV may be disposed over the first and second transistor electrodes TE1 and TE2 and the third power conductive layer PL2c. The protective layer PSV may be formed as a single layer or a multi-layer, and include various kinds of inorganic insulating materials, including silicon oxide $(SiO_x)$, silicon nitride $(SiN_x)$, silicon oxynitride $(SiO_xN_y)$, aluminum nitride $(AlN_x)$, aluminum oxide $(AlO_x)$, zirconium oxide $(ZrO_x)$, hafnium oxide $(HfO_x)$, and titanium oxide $(TiO_x)$.

A via layer VIA may be disposed on the protective layer PSV. The via layer VIA may be made of an organic material to planarize a lower step difference. For example, the via layer VIA may include an organic material such as acrylic resin, epoxy resin, phenolic resin, polyamides resin, polyimides resin, polyester resin, poly-phenylene sulfide resin, or benzocyclobutene (BCB). However, embodiments are not limited thereto, and the via layer VIA may include various kinds of inorganic insulating materials, including silicon oxide $(SiO_x)$, silicon nitride $(SiN_x)$, silicon oxynitride $(SiO_xN_y)$, aluminum nitride $(AlN_x)$, aluminum oxide $(AlO_x)$, zirconium oxide $(ZrO_x)$, hafnium oxide $(HfO_x)$, and titanium oxide $(TiO_x)$.

Insulating pattern layers INP of the light emitting element layer LEL may be disposed on the via layer VIA of the pixel circuit layer PCL. In one or more embodiments, the insulating pattern layers INP may have various shapes. In an embodiment, the insulating pattern layers INP may have a shape protruding in the third direction DR3 on the base layer BSL. The insulating pattern layers INP may have an inclined surface inclined at a specific angle with respect to the base layer BSL. However, embodiments are not limited thereto, and the insulating pattern layers INP may have a sidewall having a curved shape, a stepped shape, or the like. In an example, the insulating pattern layers INP may have a section having a semicircular shape, a semi-elliptical shape, or the like.

In one or more embodiments, the via layer VIA may be designated (or mentioned) as a lower insulating layer.

Electrodes ALE and a first insulating layer INS1, which are disposed on an upper surface of the insulating pattern layers INP, may have a shape corresponding to the insulating pattern layers INP. In an example, the electrodes ALE disposed on the insulating pattern layers INP may include an inclined surface or a curved surface, which has a shape corresponding to the shape of the insulating pattern layers INP. Accordingly, the insulating pattern layers INP and the electrodes ALE disposed on the insulating pattern layers INP may function as a reflective member for guiding light emitted from light emitting elements LD in a front direction of the pixel PXL, i.e., the third direction DR3, thereby improving the light emission efficiency of the display panel PNL.

The insulating pattern layers INP may include at least one organic material and/or at least one inorganic material. In an example, the insulating pattern layers INP may include an organic material such as acrylic resin, epoxy resin, phenolic resin, polyamide resin, polyimide resin, polyester resin, poly-phenylene sulfide resin, or benzocyclobutene (BCB). However, embodiments are not limited thereto, and the insulating pattern layers INP may include various kinds of inorganic insulating materials, including silicon oxide $(SiO_x)$, silicon nitride $(SiN_x)$, silicon oxynitride $(SiO_xN_y)$, aluminum nitride $(AlN_x)$, aluminum oxide $(AlO_x)$, zirconium oxide $(ZrO_x)$, hafnium oxide $(HfO_x)$, and titanium oxide $(TiO_x)$.

The electrodes ALE may be disposed on the via layer VIA and the insulating pattern layers INP. The electrodes ALE may be spaced apart from each other in the pixel PXL. The electrodes ALE may be disposed in (or formed as) a same layer. The electrodes ALE may be simultaneously formed by a same process, but embodiments are not limited thereto.

The electrodes ALE may be supplied with an alignment signal in a process of aligning the light emitting elements LD. Accordingly, an electric filed may be formed between the electrodes ALE, so that the light emitting elements LD disposed in each pixel PXL may be aligned between the electrodes ALE.

The electrodes ALE may include at least one conductive material. In an example, the electrodes ALE may include at least one metal or any alloy including a same among various metallic materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, at least one conductive oxide such as Indium Tin Oxide (ITO), Indium Zinc Oxide (IZO), Indium Tin Zinc Oxide (ITZO), Zinc Oxide (ZnO), Aluminum doped Zinc Oxide (AZO), Gallium doped Zinc Oxide (GZO), Zinc Tin Oxide (ZTO), Gallium Tin Oxide (GTO), and Fluorine doped Tin Oxide (FTO), and at least one conductive material among conductive polymers such as PEDOT, but embodiments are not limited thereto.

The first insulating layer INS1 may be disposed over the electrodes ALE. The first insulating layer INS1 may be formed as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A first bank BNK1 may be disposed on the first insulating layer INS1. The first bank BNK1 may form a dam structure defining an emission area in which light emitting elements LD are to be supplied in a process of supplying the light emitting elements LD to each of the pixels PXL. The first bank BNK1 may protrude in a thickness direction of the base layer BSL (e.g., the third direction DR3). For example, a desired kind and/or amount of light emitting element ink may be supplied to the area defined by the first bank BNK1.

The first bank BNK1 may include an organic material such as acrylic resin, epoxy resin, phenolic resin, polyamide resin, polyimide resin, polyester resin, poly-phenylene sulfide resin, or benzocyclobutene (BCB). However, embodiments are not limited thereto, and the first bank BNK1 may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In one or more embodiments, the first bank BNK1 may include at least one light blocking material and/or at least one reflective material. Accordingly, light leakage between adjacent pixels PXL may be prevented. For example, the first bank BNK1 may include at least one black matrix material and/or at least one color filter material. In an example, the first bank BNK1 may be formed as a black opaque pattern layer capable of blocking transmission of light. In an embodiment, a reflective layer or the like may be formed on a surface (e.g., a sidewall) of the first bank BNK1 to improve the light efficiency of each pixel PXL.

The light emitting elements LD may be disposed on the first insulating layer INS1. The light emitting elements LD may be disposed in an area surrounded by the first bank BNK1. The light emitting elements LD may be disposed between the electrodes ALE on the first insulating layer INS1. The light emitting elements LD may be provided in a form in which the light emitting elements LD are dispersed in a light emitting element ink to be supplied to each of the pixels PXL by an inkjet printing process, or the like. In an example, the light emitting elements LD may be dispersed in a volatile solvent to be provided to each pixel PXL. Subsequently, in case that an alignment signal is supplied through the electrodes ALE, the light emitting elements LD may be aligned between the electrodes ALE, in case that an electric field is formed between the electrodes ALE. After the light emitting elements LD are aligned, the solvent may be volatilized or removed by other processes, so that the light emitting elements LD may be stably arranged between the electrodes ALE.

A second insulating layer INS2 may be disposed on the light emitting elements LD. For example, the second insulating layer INS2 may be disposed (e.g., partially disposed) on the light emitting elements LD, and expose first and second end portions EP1 and EP2 of the light emitting elements LD. In case that the second insulating layer INS2 is formed on the light emitting elements LD after the alignment process of the light emitting elements LD is completed, the light emitting elements LD may be prevented from being separated from a position at which the light emitting elements LD are aligned.

In one or more embodiments, a portion of the second insulating layer INS2 may be disposed on the first insulating layer INS1 and/or the first bank BNK1. For example, the second insulating layer INS2 may be disposed in at least a partial area of the pixel PXL with exposing at least a portion of the light emitting element LD.

The second insulating layer INS2 may be formed as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The connection electrodes ELT may be disposed on the first and second end portions EP1 and EP2 of the light emitting elements LD, which are exposed by the second insulating layer INS2. The connection electrodes ELT may be disposed in (or formed as) a same layer. For example, the connection electrodes ELT may be formed as a same conductive layer. The connection electrodes ELT may be simultaneously formed by a same process. However, embodiments are not limited to the above-described example. For example, the connection electrodes ELT may be formed by different processes. For example, a first connection electrode ELT1, a third connection electrode ELT3, and a fifth connection electrode ELT5 may be patterned, and a second connection electrode ELT2 and a fourth connection electrode ELT4 may be patterned.

The first connection electrode ELT1 may be disposed (e.g., directly disposed) on first end portions EP1 of first light emitting elements LD1 to be in contact with the first end portions EP1 of the first light emitting elements LD1.

For example, the second connection electrode ELT2 may be disposed (e.g., directly disposed) on second end portions EP2 of the first light emitting elements LD1 to be in contact with the second end portions EP2 of the first light emitting elements LD1. The second connection electrode ELT2 may be disposed (e.g., directly disposed) on first end portions of second light emitting elements LD2 to be in contact with the first end portions of the second light emitting elements LD2. For example, the second connection electrode ELT2 may connect (e.g., electrically connect) the second end portions EP2 of the first light emitting elements LD1 and the first end portions of the second light emitting elements LD2 to each other.

For example, the third connection electrode ELT3 may be disposed (e.g., directly disposed) on second end portions of the second light emitting elements LD2 to be in contact with the second end portions of the second light emitting elements LD2. The third connection electrode ELT3 may be disposed (e.g., directly disposed) on first end portions of third light emitting elements LD3 to be in contact with the first end portions of the third light emitting elements LD3. For example, the third connection electrode ELT3 may connect (e.g., electrically connect) the second end portions of the second light emitting elements LD2 and the first end portions of the third light emitting elements LD3 to each other.

For example, the fourth connection electrode ELT4 may be disposed (e.g., directly disposed) on second end portions EP2 of the third light emitting elements LD3 to be in contact with the second end portions EP2 of the third light emitting elements LD3. The fourth connection electrode ELT4 may be disposed (e.g., directly disposed) on first end portions EP1 of fourth light emitting elements LD4 to be in contact with the first end portions EP1 of the fourth light emitting elements LD4. For example, the fourth connection electrode ELT4 may connect (e.g., electrically connect) the second end portions EP2 of the third light emitting elements LD3 and the first end portions EP1 of the fourth light emitting elements LD4 to each other.

For example, the fifth connection electrode ELT5 may be disposed (e.g., directly disposed) on second end portions EP2 of the fourth light emitting elements LD4 to be in contact with the second end portions EP2 of the fourth light emitting elements LD4.

The connection electrodes ELT may be formed of various transparent conductive materials. In an example, the connection electrodes ELT may include at least one of various transparent conductive materials including Indium Tin Oxide (ITO), Indium Zinc Oxide (IZO), Indium Tin Zinc Oxide (ITZO), Aluminum doped Zinc Oxide (AZO), Gallium doped Zinc Oxide (GZO), Zinc Tin Oxide (ZTO), and Gallium Tin Oxide (GTO), and be implemented substantially transparently or translucently to satisfy a specific transmittance. Accordingly, light emitted from the first and second end portions EP1 and EP2 of the light emitting elements LD may be emitted to the outside of the display panel PNL with passing through the connection electrodes ELT.

In accordance with an embodiment, a first conductive connection pattern layer CCP1, which forms the first connection electrode ELT1, the third connection electrode ELT3, and the fifth connection electrode ELT5, and a second conductive connection pattern layer CCP2, which forms the second connection electrode ELT2 and the fourth connection electrode ELT4, may be formed by different processes.

In accordance with an embodiment, a third insulating layer INS3 may be disposed between the first conductive connection pattern layer CCP1 and the second conductive connection pattern layer CCP2. The third insulating layer INS3 may prevent a short-circuit defect between the first conductive connection pattern layer CCP1 and the second conductive connection pattern layer CCP2. For example, the third insulating layer INS3 may be disposed between the first connection electrode ELT1 and the second connection electrode ELT2, and be disposed between the fourth connection electrode ELT4 and the fifth connection electrode ELT5. In one or more embodiments, a fourth insulating layer INS4 may be disposed at an outer portion of the light emitting element layer LEL. The fourth insulating layer INS4 may protect the light emitting element layer LEL from external influence or foreign substance.

In accordance with an embodiment, each of the third insulating layer INS3 and the fourth insulating layer INS4 may be formed as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

Figure 9:
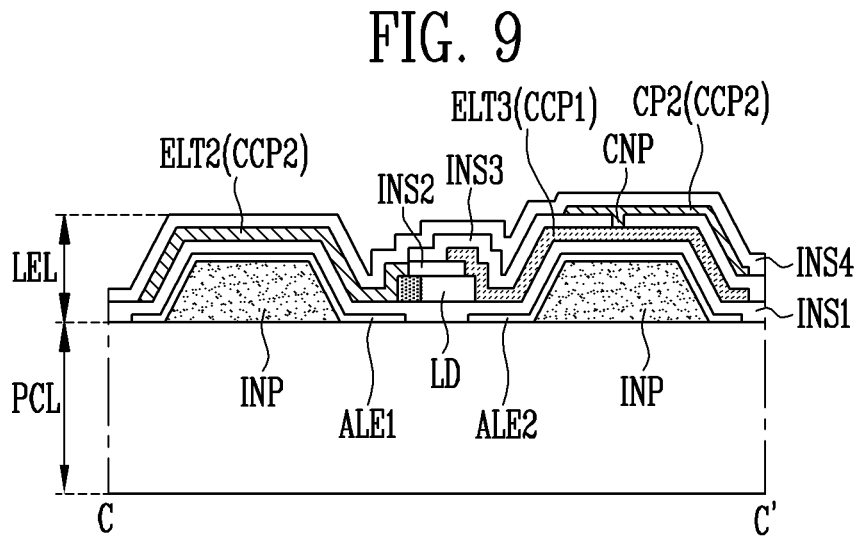
FIG. 9 is a schematic sectional view taken along line C-C' shown in FIG. 6.

For example, a stacked structure of the pixel PXL including a conductive pattern layer CP in accordance with an embodiment will be described with reference to FIG. 9. FIG. 9 is a schematic sectional view taken along line C-C' shown in FIG. 6. In FIG. 9, a schematic sectional structure of the second serial part SP2 among the serial parts SP is illustrated. Technical features of the second serial part SP2 (or the second conductive pattern layer CP2) described with reference to FIG. 9 may be similarly applied to other serial parts SP (or the conductive pattern layers CP1, CP3, and CP4).

Referring to FIG. 9, the second conductive pattern layer CP2 included in the second conductive connection pattern layers CCP2 may be connected (e.g., electrically connected) to an electrode component (e.g., the third connection electrode ELT3) included in the first conductive connection pattern layers CCP1 through a contact part CNP. For example, the contact part CNP may penetrate at least a portion of the third insulating layer INS3 interposed between the first conductive connection pattern layer CCP1 and the second conductive connection pattern layers CCP2, and the second conductive pattern layer CP2 and the third connection electrode ELT3 may be connected to each other through the contact part CNP.

In accordance with an embodiment, the second conductive pattern layer CP2 may be a component for a repair process performed in case that the second light emitting elements LD2 of the second serial part SP2 are abnormally disposed. For example, it may be checked whether the second light emitting elements LD2 have been normally disposed or arranged, and a repair process for electrically connecting the second conductive pattern layer CP2 and the second connection electrode ELT2 to each other may be performed in case that the second light emitting elements LD2 are abnormally disposed or arranged. Electrodes at a side (e.g., the second connection electrode ELT2) and electrodes at another side (e.g., the second conductive pattern layer CP2) with respect to positions at which the second light emitting elements LD2 are disposed may be disposed in (or formed as) a same layer. In case that a repair conductive pattern layer RCP is patterned so as to perform the repair process, the electrodes at the side and the electrodes at another side may be connected to each other, and the repair process may be performed with a high reliability in case that some of the serial parts SP are abnormally manufactured. Consequently, a problem that a dark spot occurs since the pixel PXL is inadequately manufactured may be substantially solved.

In this embodiment, the second light emitting elements LD2 of the second serial part SP2 may be normally disposed to be in an operable state. In FIG. 9, the pixel PXL may have a structure in which the repair process is not performed. In one or more embodiments, a detailed structure of the pixel PXL on which the repair process is performed will be described below with reference to FIGS. 12 to 15.

Figure 10:
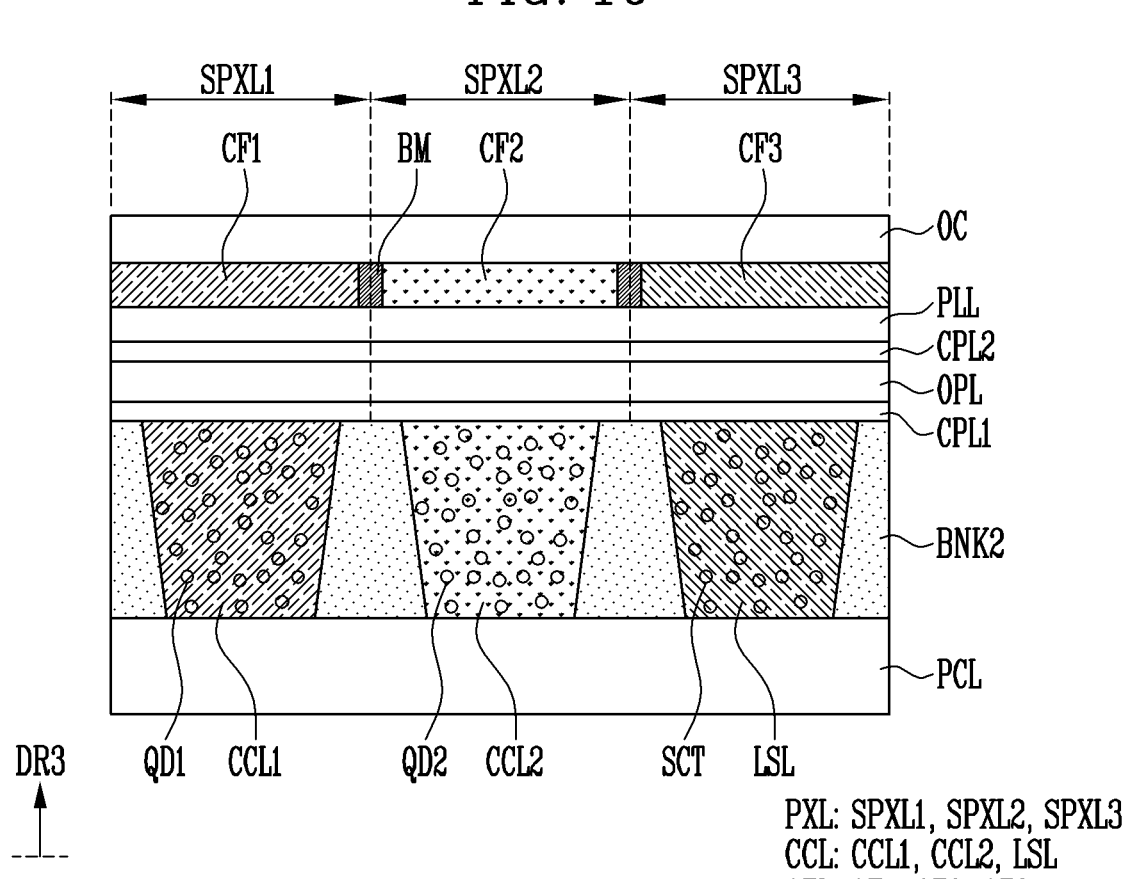
FIG. 10 is a schematic sectional view illustrating first to third sub-pixels in accordance with an embodiment.
Figure 11:
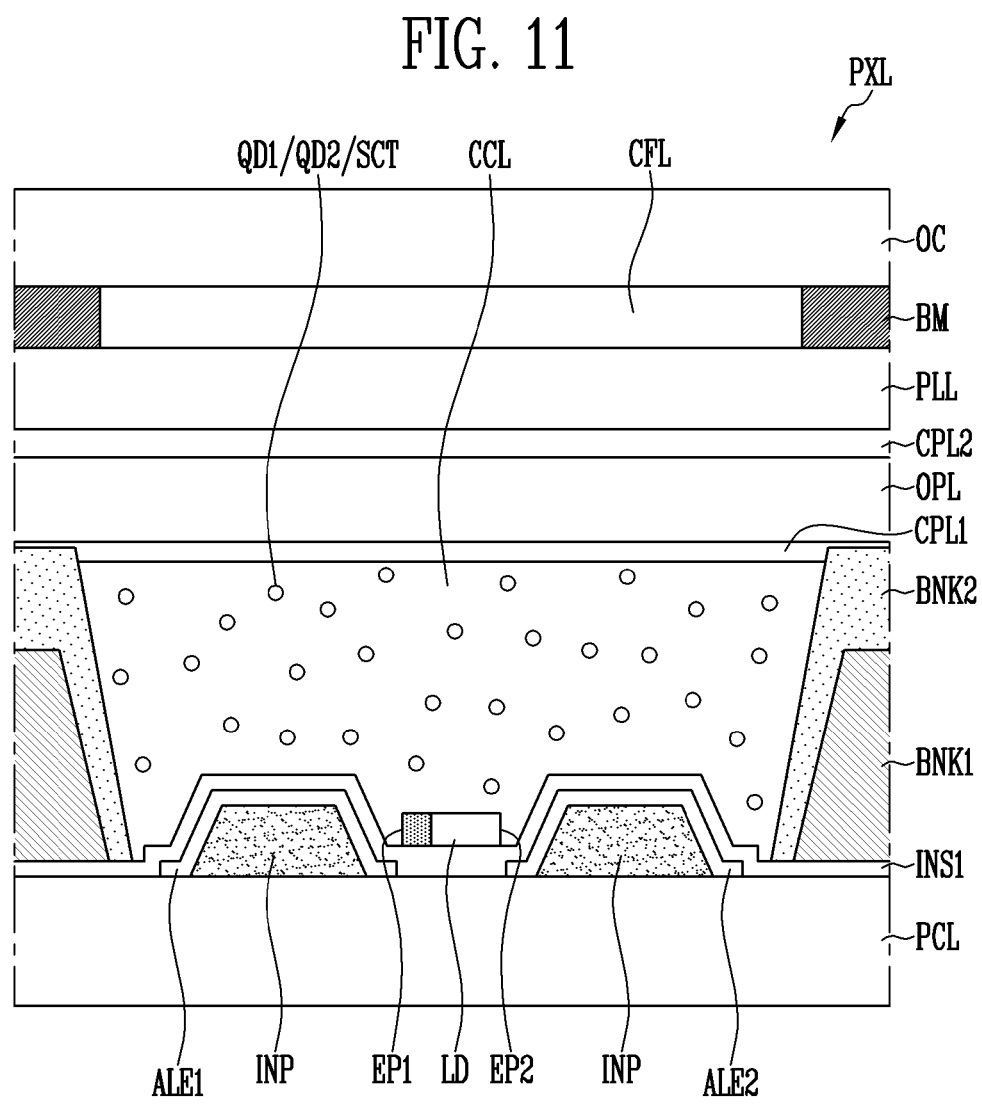
FIG. 11 is a schematic sectional view of a pixel in accordance with an embodiment.
Figure 11:

For example, a sectional structure of a pixel PXL including a color conversion layer CCL and a color filter layer CFL will be described with reference to FIGS. 10 and 11. FIG. 10 is a schematic sectional view illustrating first to third sub-pixels in accordance with an embodiment. FIG. 11 is a schematic sectional view of a pixel in accordance with an embodiment.

FIG. 10 illustrates a second bank BNK2, the color conversion layer CCL, an optical layer OPL, and/or the color filter layer CFL. In FIG. 10, for convenience of description, a portion of the detailed configuration of the pixel circuit layer PCL and the light emitting element layer LEL, which are shown in FIGS. 6 and 8, will be omitted. FIG. 11 illustrates in detail a stacked structure of the pixel PXL in relation to the second bank BNK2, the color conversion layer CCL, the optical layer OPL, and/or the color filter layer CFL. For descriptive convenience, illustration of some electrode layers and some insulating layers is omitted in FIG. 11.

Referring to FIGS. 10 and 11, the second bank BNK2 may be disposed between first to third sub-pixels SPXL1, SPXL2, and SPXL3 or at a boundary of the first to third sub-pixels SPXL1, SPXL2, and SPXL3, and include an opening overlapping each of the first to third sub-pixels SPXL1, SPXL2, and SPXL3. The opening of the second bank BNK2 may provide a space in which the color conversion layer CCL is disposed. For example, a desired kind and/or a desired amount of color conversion layer CCL may be supplied to the space partitioned (or defined) by the opening of the second bank BNK2.

The second bank BNK2 may include an organic material such as acrylic resin, epoxy resin, phenolic resin, polyamide resin, polyimide resin, unsaturated polyester resin, poly-phenylene ether resin, poly-phenylene sulfide resin, or ben-zocyclobutene (BCB). However, embodiments are not limited thereto, and the second bank BNK2 may include various kinds of inorganic insulating materials, including silicon oxide ($SiO_x$), silicon nitride ($SiN_x$), silicon oxynitride (Si-$O_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In one or more embodiments, the second bank BNK2 may include at least one light blocking material and/or at least one reflective material. Accordingly, light leakage between adjacent pixels PXL may be prevented. For example, the second bank BNK2 may include a black pigment, but embodiments are not limited thereto.

The color conversion layer CCL may be disposed above light emitting elements LD in the opening of the second bank BNK2. The color conversion layer CCL may include a first color conversion layer CCL1 disposed in the first sub-pixel SPXL1, a second color conversion layer CCL2 disposed in the second sub-pixel SPXL2, and a light scattering layer LSL disposed in the third sub-pixel SPXL3.

In an embodiment, the first to third sub-pixels SPXL1, SPXL2, and SPXL3 may include light emitting elements LD emitting light of a same color. For example, the first to third sub-pixels SPXL1, SPXL2, and SPXL3 may include light emitting elements LD emitting light of a third color (or blue). The color conversion layer CCL including color conversion particles may be disposed on each of the first to third sub-pixels SPXL1, SPXL2, and SPXL3, so that a full-color image may be displayed.

The first color conversion layer CCL1 may include first color conversion particles for converting light of the third color, which is emitted from the light emitting element LD, into light of a first color. For example, the first color conversion layer CCL1 may include first quantum dots QD1 dispersed in a specific matrix material such as base resin.

In an embodiment, in case that the light emitting element LD is a blue light emitting element emitting light of blue, and the first sub-pixel SPXL1 is a red pixel, the first color conversion layer CCL1 may include a first quantum dot QD1 for converting light of blue, which is emitted from the blue light emitting element, into light of red. The first quantum dot QD1 may absorb blue light and emit red light by shifting a wavelength of the blue light according to energy transition. In case that the first sub-pixel SPXL1 is a pixel of a different color, the first color conversion layer CCL1 may include a first quantum dot QD1 corresponding to the color of the first sub-pixel SPXL1.

The second color conversion layer CCL2 may include second color conversion particles for converting light of the third color, which is emitted from the light emitting element LD, into light of a second color. For example, the second color conversion layer CCL2 may include second quantum dots QD2 dispersed in a specific matrix material such as base resin.

In an embodiment, in case that the light emitting element LD is a blue light emitting element emitting light of blue, and the second sub-pixel SPXL2 is a green pixel, the second color conversion layer CCL2 may include a second quantum dot QD2 for converting light of blue, which is emitted from the blue light emitting element, into light of green. The second quantum dot QD2 may absorb blue light and emit green light by shifting a wavelength of the blue light according to energy transition. In case that the second sub-pixel SPXL2 is a pixel of another color, the second color conversion layer CCL2 may include a second quantum dot QD2 corresponding to the color of the second sub-pixel SPXL2.

In an embodiment, light of blue having a relatively short wavelength in a visible light band may be incident into the first quantum dot QD1 and the second quantum dot QD2, so that absorption coefficients of the first quantum dot QD1 and the second quantum dot QD2 may be increased. Accordingly, the efficiency of light finally emitted from the first sub-pixel SPXL1 and the second sub-pixel SPXL2 may be improved, and excellent color reproduction may be ensured. For example, the light emitting unit EMU of each of the first to third sub-pixels SPXL1, SPXL2, and SPXL3 may be formed by using light emitting elements of a same color (e.g., blue light emitting elements), so that the manufacturing efficiency of the display device may be improved.

The light scattering layer LSL may be disposed to efficiently use light of the third color (or blue) emitted from the light emitting element LD. In an example, in case that the light emitting element LD is a blue light emitting element emitting light of blue, and the third pixel PXL3 is a blue pixel, the light scattering layer LSL may include at least one kind of light scattering particle SCT to efficiently use light emitted from the light emitting element LD. In an example, the light scattering particle SCT of the light scattering layer LSL may include at least one of barium sulfate ($BaSO_4$), calcium carbonate ($CaCO_3$), titanium oxide ($TiO_2$), silicon oxide ($SiO_2$), aluminum oxide ($Al_2O_3$), zirconium oxide ($ZrO_2$), and zinc oxide (ZnO). The light scattering particle SCT may not be disposed only in the third sub-pixel SPXL3, and may be selectively included in the first color conversion layer CCL2 or the second color conversion layer CCL2. In one or more embodiments, the light scattering particle SCT may be omitted such that the light scattering layer LSL formed of with transparent polymer may be disposed.

A first capping layer CPL1 may be disposed on the color conversion layer CCL. The first capping layer CPL1 may extend throughout the first to third sub-pixels SPXL1, SPXL2, and SPXL3. The first capping layer CPL1 may cover the color conversion layer CCL. The first capping layer CPL1 may prevent the color conversion layer CCL from being damaged or contaminated due to infiltration of an impurity such as moisture or air from the outside.

The first capping layer CPL1 may be an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), and the like.

The optical layer OPL may be disposed on the first capping layer CPL. The optical layer OPL may function to improve light extraction efficiency by recycling light transmitted from the color conversion layer CCL through total reflection. For example, the optical layer OPL may have a refractive index relatively lower than a refractive index of the color conversion layer CCL. For example, the refractive index of the color conversion layer may be about 1.6 to about 2.0, and the refractive index of the optical layer OPL may be about 1.1 to about 1.3.

A second capping layer CPL2 may be disposed on the optical layer OPL. The second capping layer CPL2 may extend throughout the first to third sub-pixels SPXL1, SPXL2, and SPXL3. The second capping layer CPL2 may cover the optical layer OPL. The second capping layer CPL2 may prevent the optical layer OPL from being damaged or contaminated due to infiltration of an impurity such as moisture or air from the outside.

The second capping layer CPL2 may be an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), and the like.

A planarization layer PLL may be disposed on the second capping layer CPL2. The planarization layer PLL may be disposed on the first to third sub-pixels SPXL1, SPXL2, and SPXL3.

The planarization layer PLL may include an organic material such as acrylic resin, epoxy resin, phenolic resin, polyamide resin, polyimide resin, unsaturated polyester resin, poly-phenylene ether resin, poly-phenylene sulfide resin, or benzocyclobutene (BCB). However, embodiments are not limited thereto, and the planarization layer PLL may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The color filter layer CFL may be disposed on the planarization layer PLL. The color filter layer CFL may include color filters CF1, CF2, and CF3 which accord with a color of each pixel PXL. The color filters CF1, CF2, and CF3 which accord with a color of each of the first to third sub-pixels SPXL1, SPXL2, and SPXL3 may be disposed, so that a full-color image may be displayed.

The color filter layer CFL may include a first color filter CF1 disposed in the first sub-pixel SPXL1 to selectively transmit light emitted from the first sub-pixel SPXL1 therethrough, a second color filter CF2 disposed in the second sub-pixel SPXL2 to selectively transmit light emitted from the second sub-pixel SPXL2 therethrough, and a third color filter CF3 disposed in the third sub-pixel SPXL3 to be selectively transmit light emitted from the third sub-pixel SPXL3 therethrough.

In an embodiment, the first color filter CF1, the second color filter CF2, and the third color filter CF3 may be respectively a red color filter, a green color filter, and a blue color filter, but embodiments are not limited thereto. Hereinafter, in case that an arbitrary color filter among the first color filter CF1, the second color filter CF2, and the third color filter CF3 is designated (or mentioned) or in case that two or more kinds of color filters are inclusively designated (or mentioned), the corresponding color filter or the corresponding color filters are referred to as a "color filter CF" or "color filters CF."

The first color filter CF1 may overlap the first color conversion layer CCL1 of the first sub-pixel SPXL1 in the third direction DR3. The first color filter CF1 may include a color filter material for selectively transmit light of a first color (or red) therethrough. For example, in case that the first sub-pixel SPXL1 is a red pixel, the first color filter CF1 may include a red color filter material.

The second color filter CF2 may overlap the second color conversion layer CCL2 of the second sub-pixel SPXL2 in the third direction DR3. The second color filter CF2 may include a color filter material for selectively transmitting light of a second color (or green) therethrough. For example, in case that the second sub-pixel SPXL2 is a green pixel, the second color filter CF2 may include a green color filter material.

The third color filter CF3 may overlap the light scattering layer LSL of the third sub-pixel SPXL3 in the third direction DR3. The third color filter CF3 may include a color filter material for selectively transmitting light of a third color (or blue) therethrough. For example, in case that the third sub-pixel SPXL3 is a blue pixel, the third color filter CF3 may include a blue color filter material.

In one or more embodiments, a light blocking layer BM may be further disposed between the first to third color filters CF1, CF2, and CF3. As described above, in case that the light blocking layer BM is formed between the first to third color filters CF1, CF2, and CF3, a color mixture defect viewed at the front or side of the display device may be prevented. The material of the light blocking layer BM is not limited thereto, and the light blocking layer BM may be formed of various light blocking materials. In an example, the light blocking layer BM may be implemented by stacking the first to third color filters CF1, CF2, and CF3.

An overcoat layer OC may be disposed on the color filter layer CFL. The overcoat layer OC may extend throughout the first to third sub-pixels SPXL1, SPXL2, and SPXL3. The overcoat layer OC may cover a lower member including the color filter layer CFL. The overcoat layer OC may prevent moisture or air from infiltrating into the above-described lower member. The overcoat layer OC may protect the above-described lower member from a foreign matter such as dust.

The overcoat layer OC may include an organic material such as acrylic resin, epoxy resin, phenolic resin, polyamide resin, polyimide resin, unsaturated polyester resin, poly-phenylene ether resin, poly-phenylene sulfide resin, or benzocyclobutene (BCB). However, embodiments are not limited thereto, and the overcoat layer OC may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

For example, a pixel PXL in accordance with an embodiment will be described with reference to FIGS. 12 to 15. In FIGS. 12 to 15, redundant descriptions above will be omitted or will not be repeated for descriptive convenience.

Figure 12:
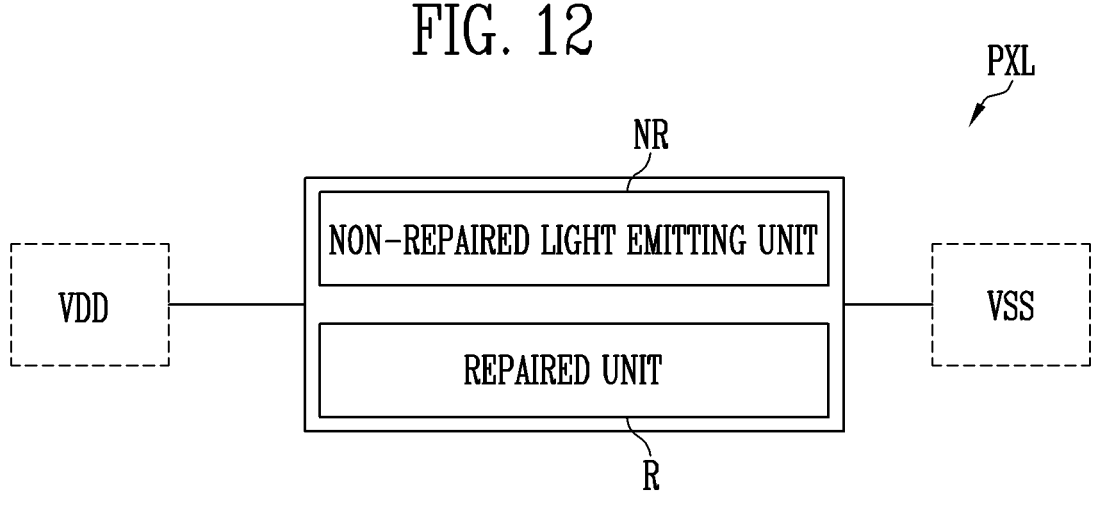
FIGS. 12 and 13 are schematic block diagrams illustrating a non-repaired light emitting unit and a repaired unit of a pixel in accordance with an embodiment.
Figure 13:
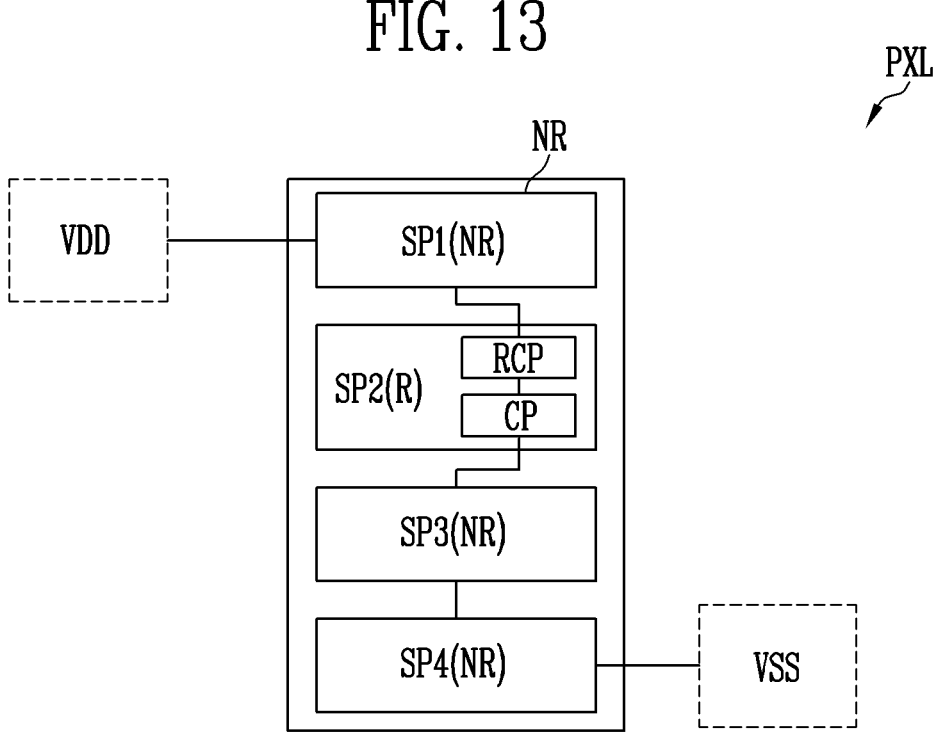
Figure 14:
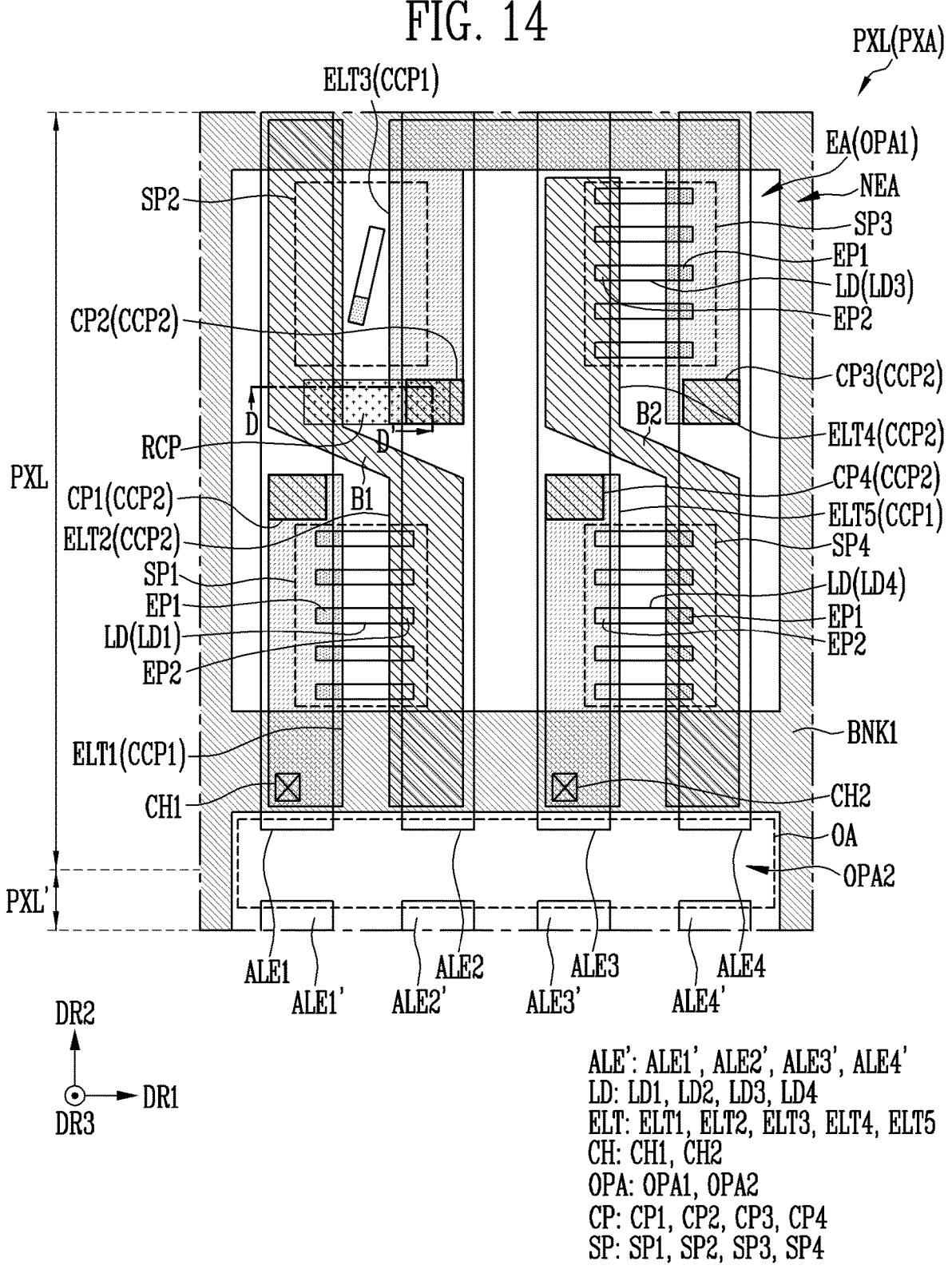
FIG. 14 is a schematic plan view illustrating a pixel in accordance with an embodiment.
Figure 15:
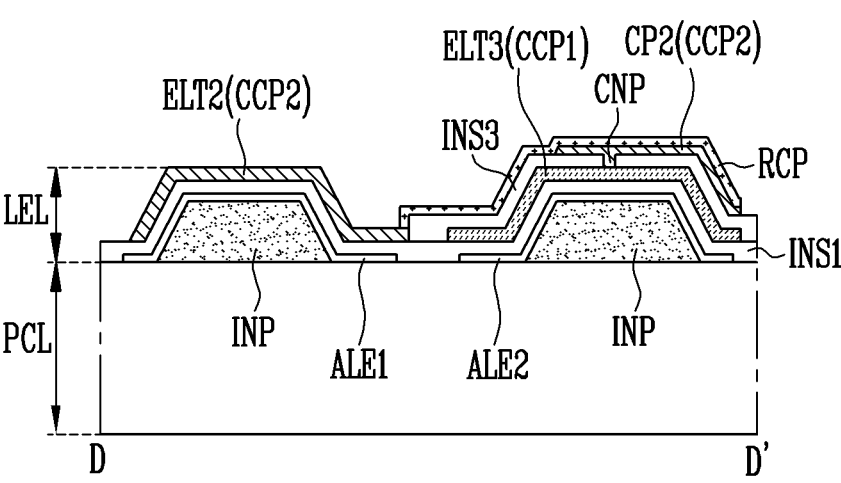
FIG. 15 is a schematic sectional view taken along line D-D' shown in FIG. 14.

FIGS. 12 and 13 are schematic block diagrams illustrating a non-repaired light emitting unit and a repaired unit of a pixel in accordance with an embodiment. FIG. 14 is a schematic plan view illustrating a pixel in accordance with an embodiment. FIG. 15 is a schematic sectional view taken along line D-D' shown in FIG. 14.

The embodiment of FIG. 14 is different from the pixel PXL in accordance with the embodiments above in that the pixel PXL in accordance with the embodiment of FIG. 14 includes a repaired unit R including a serial part SP in which a repair process is performed. In an embodiment, a first serial part SP1, a third serial part SP3, and a fourth serial part SP4 correspond to a non-repaired light emitting unit NR, and a second serial part SP2 corresponds to the repaired unit R.

Referring to FIGS. 12 and 13, the pixel PXL may include a non-repaired light emitting unit NR and a repaired unit R. For example, in case that a repair process is performed on at least one of serial parts SP, the repaired unit R may include at least one serial part SP on which the repair process is performed. For example, the pixel PXL may include a first serial part SP1, a third serial part SP3, and a fourth serial part SP4, which correspond to the non-repaired light emitting unit NR, and a second serial part SP2 which corresponds to the repaired unit R. The repair process may be performed on the second serial part SP2 in which light emitting elements LD are abnormally disposed, and an electrical path between the serial parts SP may be maintained.

As described above, it is checked whether light emitting elements LD of each of the serial parts SP have been normally disposed, so that it is determined whether connection electrodes ELT have been normally connected to each other. In case that the light emitting elements LD are abnormally disposed, an electrical path between some serial parts SP may be blocked. For example, in case that any light emitting elements LD are not disposed in the second serial part SP2 or in case that any light emitting elements LD are not disposed to connect (e.g., electrically connect) adjacent connection electrodes ELT2 and ELT3 to each other, the electrical connection between the adjacent connection electrodes ELT2 and ELT3 may be blocked. The electrical path defined (or formed) in the serial parts SP may be damaged. Since the light emitting elements LD of the serial parts SP are connected in series to each other, all the light emitting elements LD of the serial parts SP may not be normally operated in case that only any one of the serial parts SP is damaged. In order to prevent the abnormal operation and the damage, in case that an area in which light emitting elements LD are abnormally disposed is checked, the repair process may be performed on a serial part SP corresponding to the corresponding area.

In accordance with an embodiment, in case that the repair process is performed, a repair conductive pattern layer RCP may be patterned (see FIGS. 13 and 14). The repair conductive pattern layer RCP may connect (e.g., electrically connect) a non-repaired light emitting unit NR and a conductive pattern layer CP, which are adjacent to each other.

For example, in case that the light emitting elements LD are abnormally disposed in the second serial part SP2, adjacent electrodes (e.g., the second connection electrode ELT2 and the third connection electrode ELT3) of the second serial part SP2 may be electrically separated from each other, but the repair conductive pattern layer RCP formed by the repair process may connect (e.g., electrically connect) the conductive pattern layer CP and the adjacent electrodes to each other. For example, the repair conductive pattern layer RCP may connect (e.g., electrically connect) the second connection electrode ELT2 and the conductive pattern layer CP to each other. For example, before the repair conductive pattern layer RCP is connected, the second connection electrode ELT2 and the third connection electrode ELT3 may be electrically separated from each other, but the repair conductive pattern layer RCP may be connected, so that the second connection electrode ELT2, the repair conductive pattern layer RCP, the conductive pattern layer CP, and the third connection electrode ELT3 may be sequentially connected (e.g., electrically connected) to each other. Accordingly, the serial parts SP may form a normal electrical path between the first power source VDD and the second power source VSS.

For example, a planar structure and a sectional structure of the repair conductive pattern layer RCP will be described with reference to FIGS. 14 and 15.

Referring to FIGS. 14 and 15, in case that the repair process is performed, the repair conductive pattern layer RCP may be formed in a partial area among the serial parts SP. For example, in case that the repair process is applied to the second serial part SP2, the repair conductive pattern layer RCP may be patterned on a partial area corresponding to the second serial part SP2.

The repair conductive pattern layer RCP may include an ink. For example, the repair conductive pattern layer RCP may be manufactured by patterning (or jetting) an ink having conductivity and drying the patterned ink. The ink may include a conductive ink generally used in the repair process.

The repair conductive pattern layer RCP may be disposed on the second connection electrode ELT2, the third connection electrode ELT3, and the second conductive pattern layer CP2. For example, in a plan view, the repair conductive pattern layer RCP may overlap the second conductive pattern layer CP2, and overlap the second connection electrode ELT2.

The repair conductive pattern layer RCP may connect (e.g., electrically connect) an area and another area of the second conductive connection pattern layers CCP2. For example, the repair conductive pattern layer RCP may connect (e.g., electrically connect) the second connection electrode ELT2 included in the second conductive connection pattern layers CCP2 to the conductive pattern layer CP included in the second conductive connection pattern layers CCP2. For example, the repair conductive pattern layer RCP may connect (e.g., electrically connect) two or more electrode layers which are disposed in (or formed as) a same layer and are spaced apart from each other, thereby repairing a connection structure of a corresponding serial part SP. Since the components, which the repair conductive pattern layer RCP connects (e.g., electrically connects), are disposed in a same layer, the reliability of the repair process may be substantially improved.

For convenience of description, an embodiment, in which the second serial part SP2 is repaired, and the repair conductive pattern layer RCP is disposed in an area corresponding to the second serial part SP2, is described. However, embodiments are not limited thereto. For example, in case that it is necessary to repair one or more of the other serial parts SP instead of the second serial part SP2, the repair conductive pattern layer RCP may be formed in each of serial parts SP of which the repair process is required.

Hereinafter, a manufacturing method for the display device in accordance with an embodiment will be described with reference to FIGS. 16 to 28. Hereinafter, for convenience of description, an embodiment, in which, since light emitting elements LD are abnormally disposed in the second serial part SP2, electrodes are not normally connected to each other, and light emitting elements LD are normally disposed in the first serial part SP1, the third serial part SP3, and the fourth serial part SP4 will be described. In FIGS. 16 to 28, redundant descriptions above will be omitted or will not be repeated for descriptive convenience.

Figure 16:
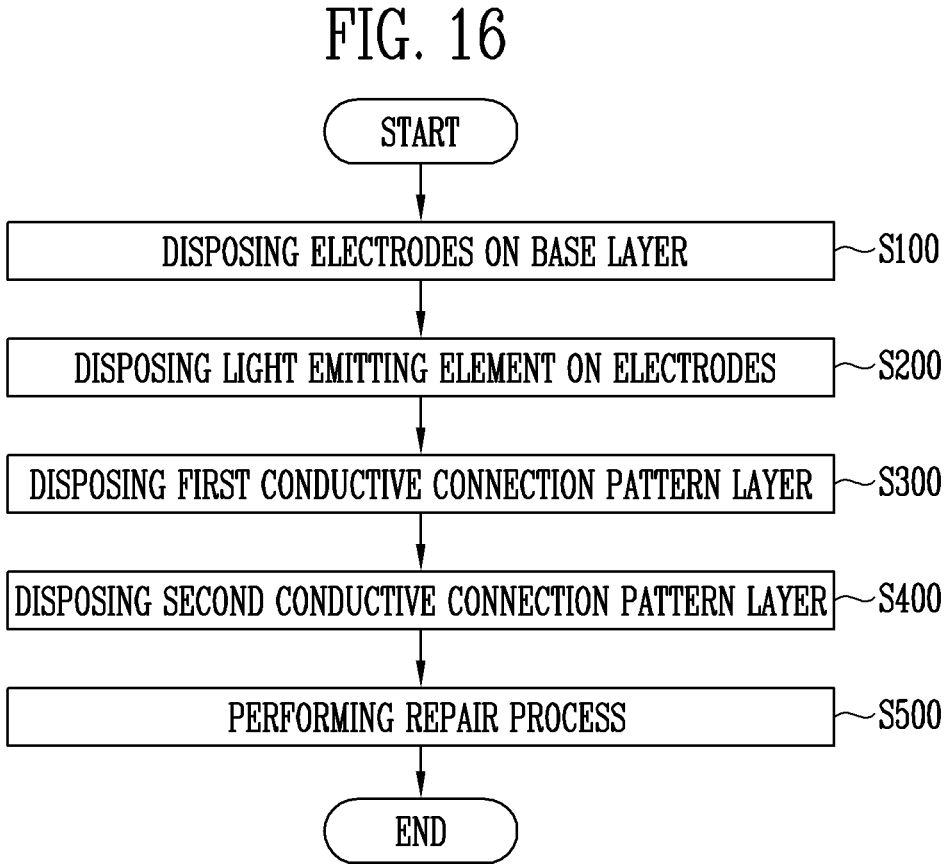
FIGS. 16 and 27 are schematic flowcharts illustrating a manufacturing method for the display device in accordance with an embodiment.
Figure 26:
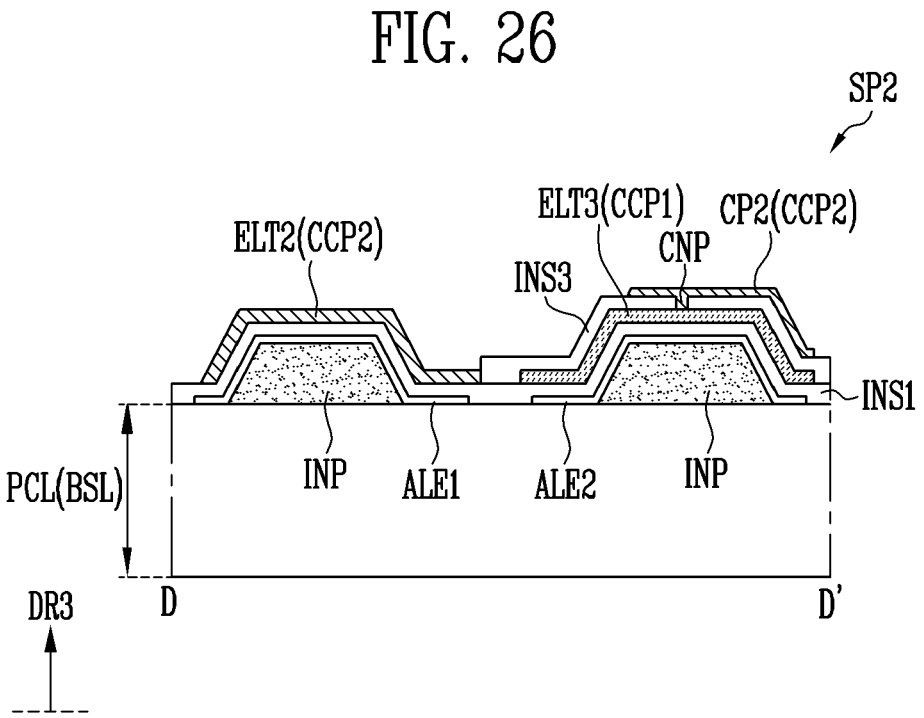
Figure 27:
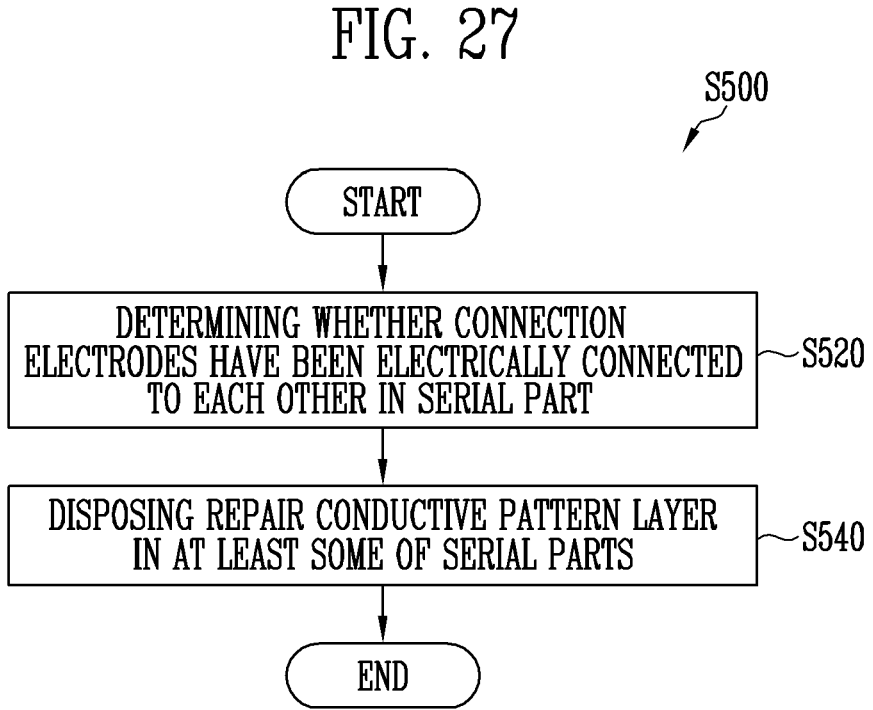

FIGS. 16 and 27 are schematic flowcharts illustrating a manufacturing method for the display device in accordance with an embodiment. FIGS. 17 to 26 and 28 are schematic process sectional views illustrating a manufacturing method for the display device in accordance with an embodiment.

FIGS. 17, 19, 21, and 24 illustrate a manufacturing method for a sectional structure of the pixel PXL described above with reference to FIG. 7. FIGS. 18, 20, 22, and 25 illustrate a manufacturing method for a sectional structure of the pixel PXL described above with reference to FIG. 9. FIGS. 18, 23, 26, and 28 illustrate a manufacturing method for a sectional structure of the pixel PXL described above with reference to FIG. 15. FIG. 27 is a flowchart illustrating phase (or step) S500 of performing a repair process described with reference to FIG. 16.

FIGS. 17, 19, 21, and 24 illustrate a sectional structure of the first serial part SP1 and the fourth serial part SP4, which are described above, and illustrate serial parts SP in which light emitting elements LD are normally disposed.

Figure 18:
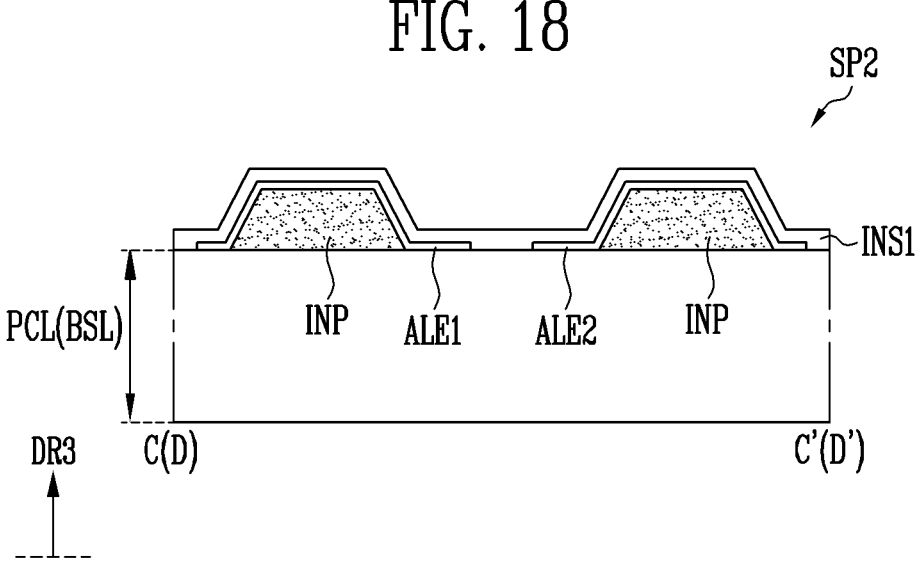
Figure 21:
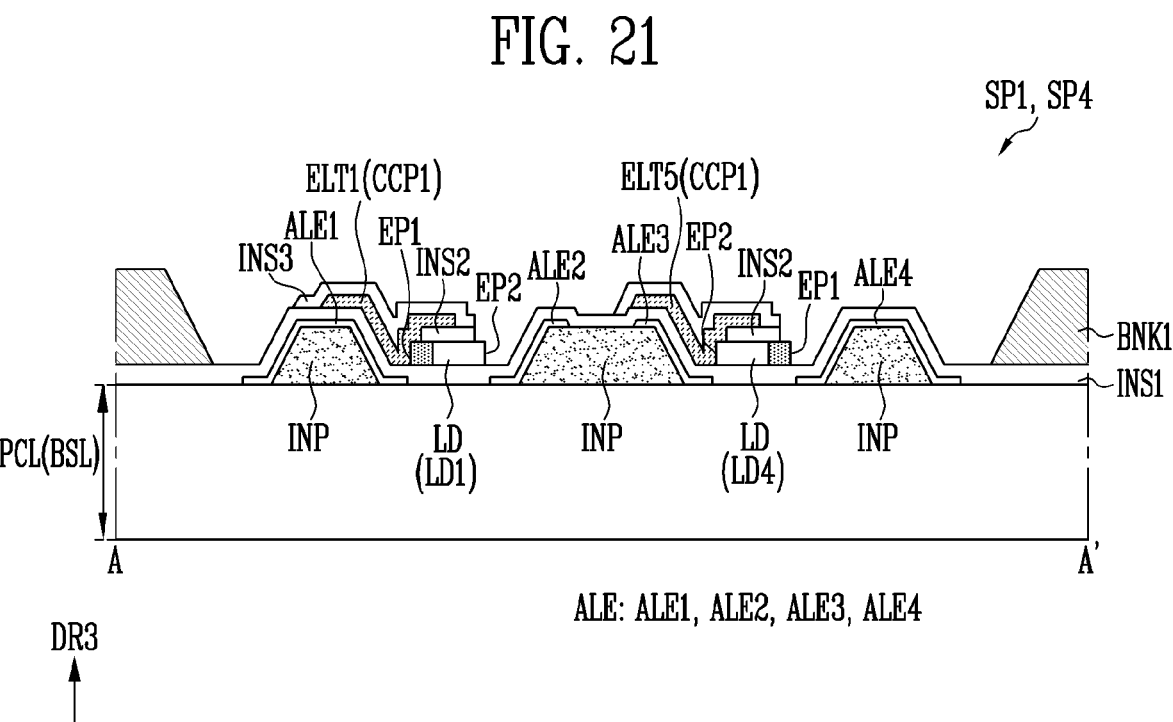
Figure 22:
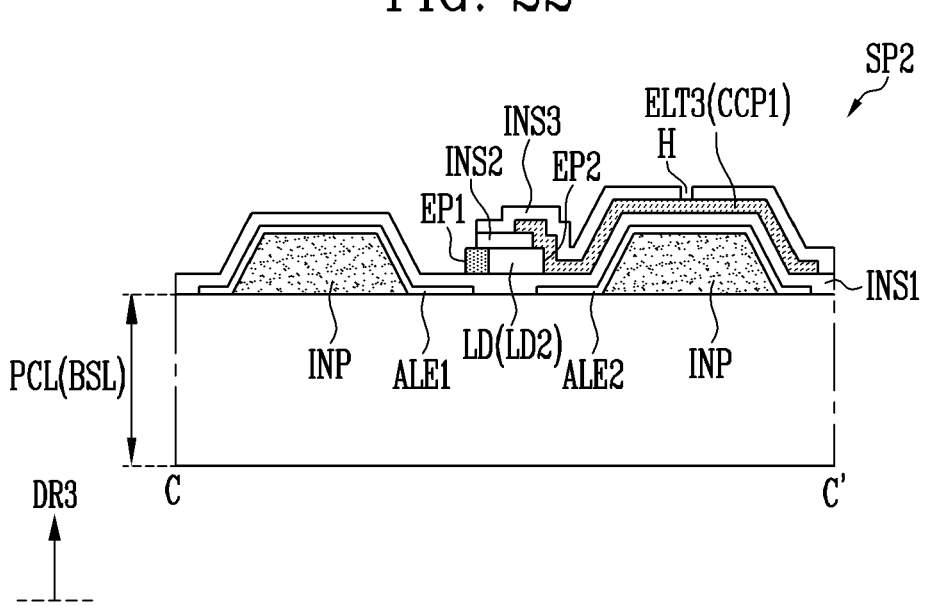
Figure 23:
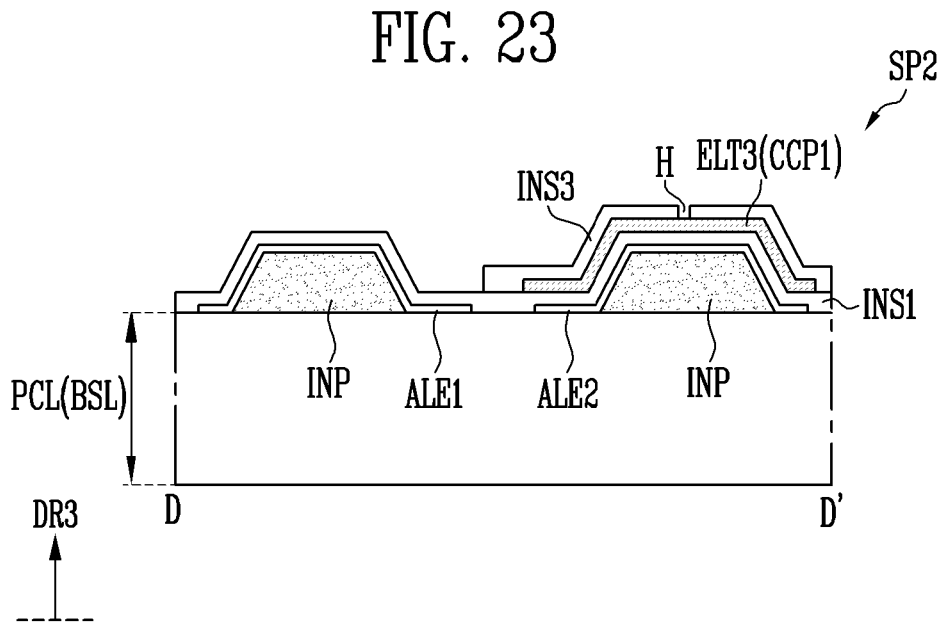
Figure 24:
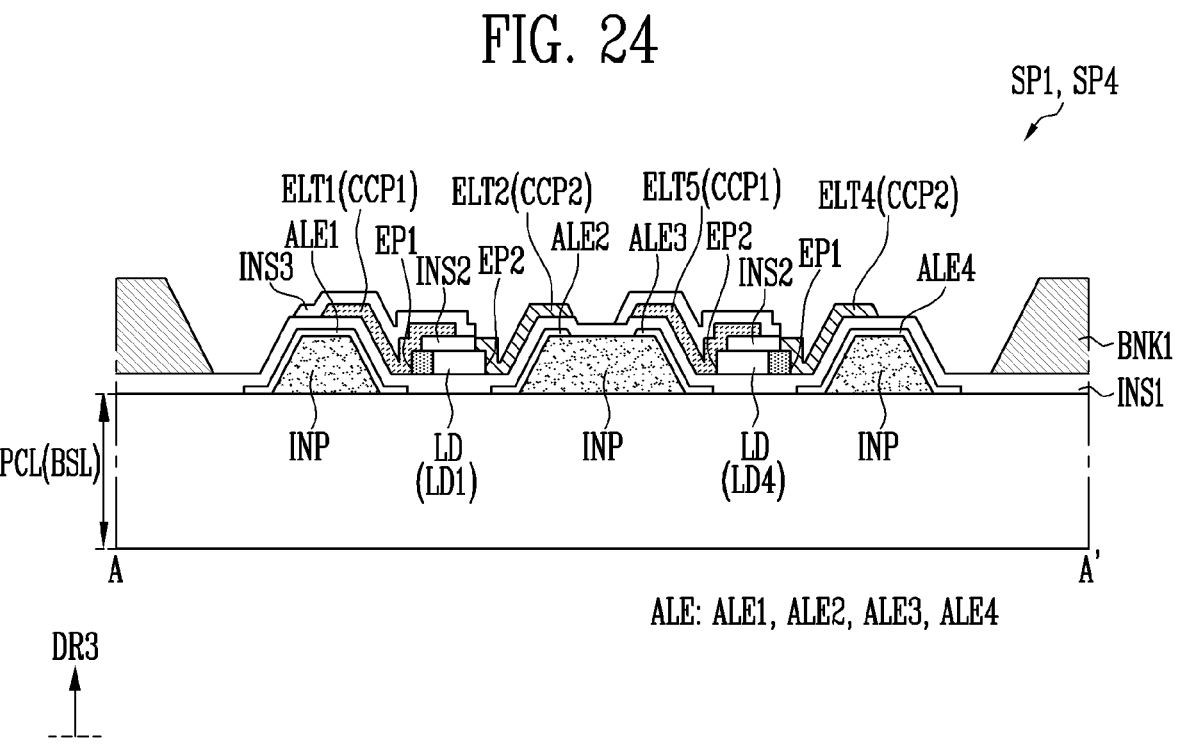

FIGS. 18, 20, 22, and 25 illustrate a sectional structure of the second serial part SP2 described above, and illustrate serial parts SP in which light emitting elements LD are normally disposed. FIGS. 18, 23, 26, and 28 illustrate a sectional structure of the second serial part SP2 described above, and illustrate serial parts SP in which the light emitting elements LD are abnormally disposed (or are not disposed). For convenience of description, FIG. 18 illustrates the second serial part SP2, and illustrates a sectional structure at a time before light emitting elements LD are provided. Hence, the sectional structure of FIG. 9 and the sectional structure of FIG. 15 are inclusively expressed.

Referring to FIG. 16, the manufacturing method for the display device DD in accordance with the embodiment may include phase (or step) S100 of disposing electrodes on a base layer, phase (or step) S200 of disposing a light emitting element on the electrodes, phase (or step) S300 of disposing a first conductive connection pattern layer, phase (or step) S400 of disposing a second conductive connection pattern layer, and phase (or step) S500 of performing a repair process.

Figure 17:
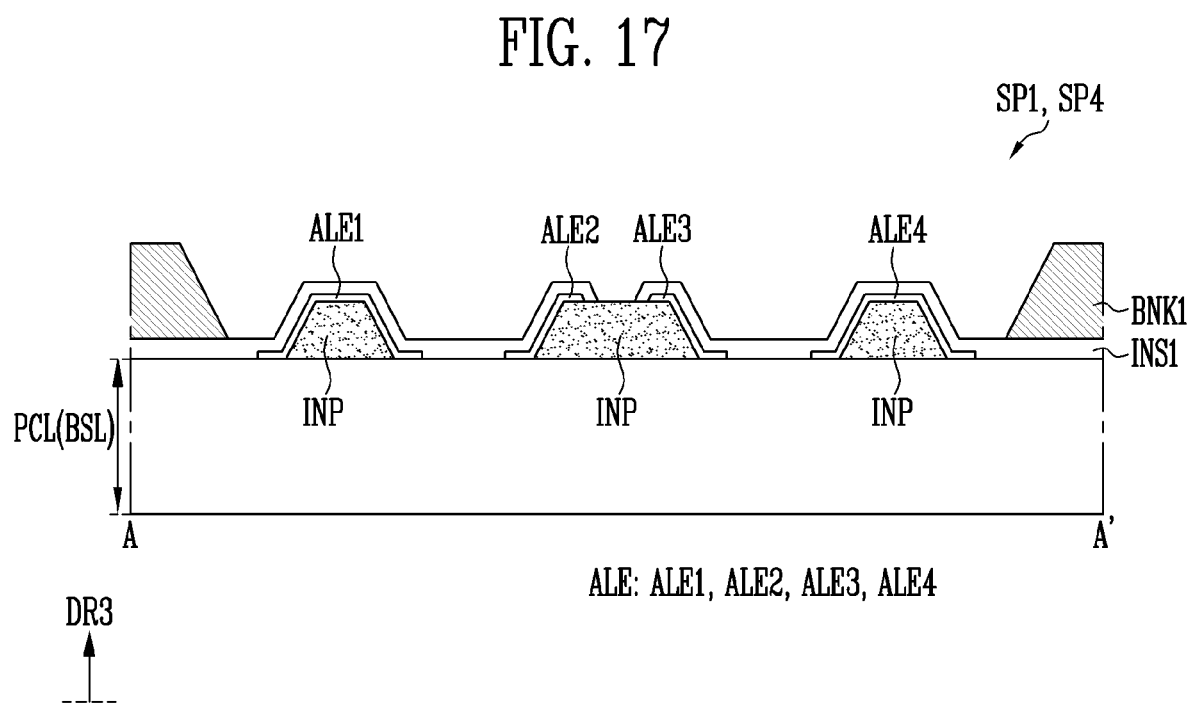

Referring to FIGS. 16, 17, and 18, in the phase (or step) S100 of disposing the electrodes on the base layer, a pixel circuit layer PCL including a base layer BSL may be formed. For example, insulating pattern layers INP may be formed on the pixel circuit layer PCL, and electrodes ALE may be formed (or patterned) on the insulating pattern layers INP. For example, a first insulating layer INS1 may be formed over the electrodes ALE, and a first bank BNK1 may be formed on the first insulating layer INS1.

In the phase (or step) S100, individual components of the pixel circuit layer PCL may be performed by patterning a conductive layer (or metal layer), an inorganic material, an organic material, or the like by a process using a mask. For example, layers described in the disclosure may be patterned similarly to the individual components of the pixel circuit layer PCL.

In the phase (or step) S100, after a base electrode is deposited on the pixel circuit layer PCL, first to fourth electrodes ALE1 to ALE4 may be patterned by etching at least a portion of the base electrode.

In the phase (or step) S100, each of the first to fourth electrodes ALE1 to ALE4 may cover at least some of the insulating pattern layers INP. Accordingly, in the phase (or step) S100, at least some of the first to fourth electrodes ALE1 to ALE4 may be formed as reflective walls.

In accordance with an embodiment, the first bank BNK1 may define (or form) a space in which a fluid may be accommodated. For example, in FIG. 17, the fluid may be accommodated between the first bank BNK1 disposed at a side and the first bank BNK1 disposed at another side.

Figure 19:
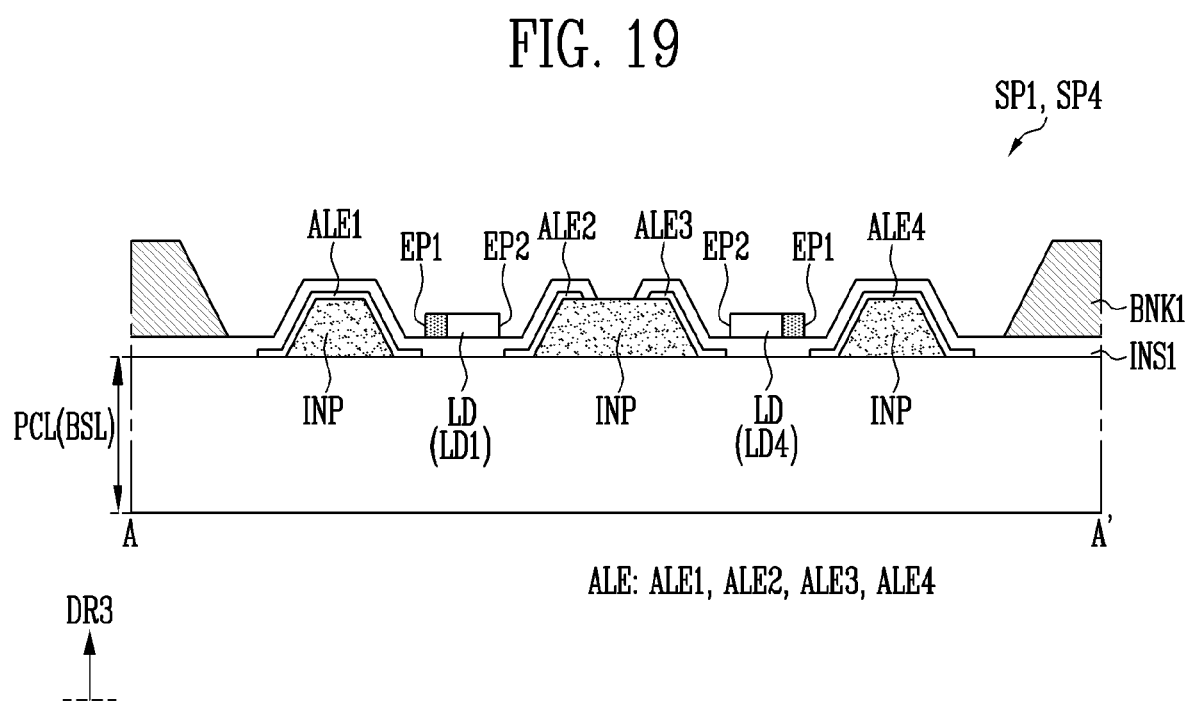
Figure 20:
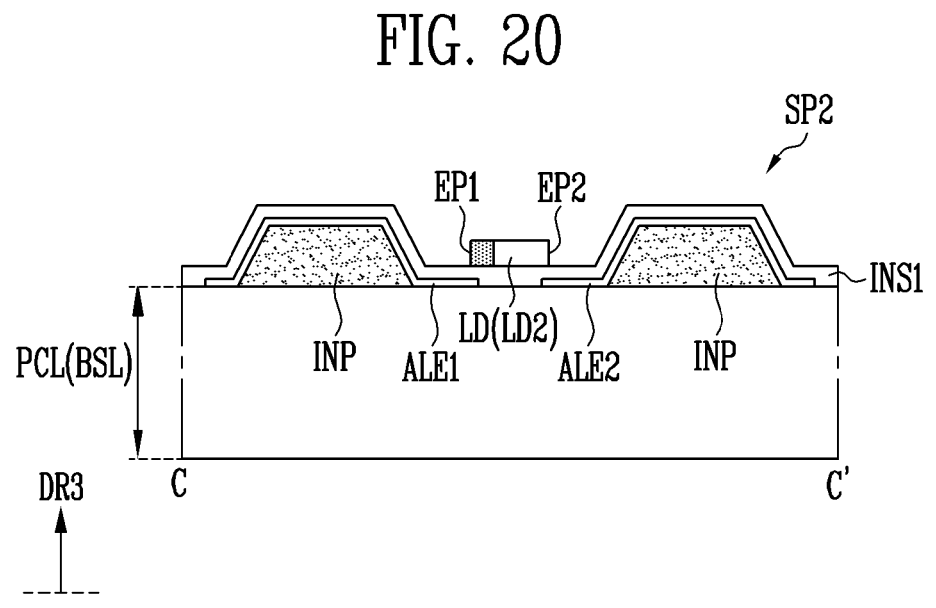

Referring to FIGS. 16, 19, and 20, in the phase (or step) S200 of disposing the light emitting element on the electrodes, light emitting elements LD may be disposed (or aligned) on the electrodes ALE. The light emitting elements LD may be disposed on the first insulating layer INS covering the electrodes ALE.

In the phase (or step) S200, an ink including light emitting elements LD may be supplied (or provided) onto the base layer BSL (or the first insulating layer INS1). In one or more embodiments, the ink may be provided by a printing apparatus including a nozzle device formed to discharge a liquid fluid to the outside. The ink may include a solvent and the light emitting elements LD. The light emitting element LD may be provided in plurality to be dispersed and provided in the solvent having fluidity. For example, in one or more embodiments, the solvent may have fluidity, and accordingly, the light emitting elements LD may be dispersed in the solvent. The solvent may include a liquid-phase material, instead of a solid-phase material, in which the light emitting elements LD are dispersed and provided. In one or more embodiments, the solvent may include an organic solvent. For example, the solvent may be one of Propylene Glycol Methyl Ether Acetate (PGMEA), Dipropylene Glycol n-Propyl Ether (DGPE), and triethylene Glycol n-Butyl Ether (TGBE). However, embodiments are not limited to the above-described example, and the solvent may include various organic solvents.

In the phase (or step) S200, the light emitting elements LD supplied onto the first insulating layer INS1 by using the ink may be aligned based on an electric field formed by the electrodes ALE. For example, an electrical signal (e.g., an alignment signal) may be provided to the electrodes ALE, so that an electric field may be formed in an area in which the light emitting elements LD are to be aligned. For example, a first alignment signal may be supplied to the first electrode ALE1 and the fourth electrode ALE4, and a second alignment signal may be supplied to the second electrode ALE2 and the third electrode ALE3. Accordingly, an electric field may be formed between the first electrode ALE1 and the second electrode ALE2 and between the second electrode ALE2 and the fourth electrode ALE4, so that the light emitting elements LD may be aligned according to the electric field. In accordance with an embodiment, the light emitting elements LD may be moved (or rotated) by a force (e.g., a dielectrophoresis (DEP) force) according to the electric field to be aligned (or disposed) on the first insulating layer INS1.

In accordance with an embodiment, the electrical signal (e.g., the alignment signal) provided to the electrodes ALE may include an AC signal. For example, the first alignment signal may be an AC signal, and the second alignment signal may be a ground signal. However, embodiments are not limited to the above-described example. The AC signal may be any one of a sine wave, a triangular wave, a square wave, a trapezoidal wave, and a pulse wave. However, embodiments are not limited thereto, and the AC signal may have various AC signal forms known in the art.

In one or more embodiments, light emitting elements LD may be abnormally disposed in some serial parts SP. For example, the light emitting elements LD may not be aligned between the electrodes ALE, or be disposed inadequately in being connected (e.g., electrically connected) to connection electrodes ELT as a subsequent process is performed. For example, light emitting elements LD supplied in a second serial part SP2 may be abnormally disposed (or aligned). Since the light emitting elements LD are not disposed in the sectional structure according to FIG. 18, the second serial part SP, in which the light emitting elements LD are not disposed, is not included in FIG. 18 for convenience of description.

Referring to FIGS. 16 and 21 to 23, in the phase (or step) S300 of disposing the first conductive connection pattern layer, a first conductive connection pattern layer CCP1 may be patterned on the base layer BSL. For example, a first connection electrode ELT1, a third connection electrode ELT3, and a fifth connection electrode ELT5 may be formed (or patterned) on the base layer BSL.

In the phase (or step) S300, at least a portion of the first conductive connection pattern layer CCP1 may be disposed on the first insulating layer INS1, and at least another portion of the first conductive connection pattern layer CCP1 may be disposed on the light emitting elements LD. For example, the first connection electrode ELT1 may be disposed on a first end portion EP1 of a first light emitting element LD1 and the first insulating layer INS1 over the first electrode ALE1. The third connection electrode ELT3 may be disposed on a second end portion EP2 of a second light emitting element LD2 and the first insulating layer INS1 over the second electrode ALE2. The fifth connection electrode ELT5 may be disposed on a second end portion EP2 of a fourth light emitting element LD4 and the first insulating layer INS1 over the third electrode ALE3.

In the phase (or step) S300, a third insulating layer INS3 may cover the first conductive connection pattern layer CCP1. For example, the third insulating layer INS3 may be deposited after the first conductive connection pattern layer CCP1 is patterned to be disposed over the first conductive connection pattern layer CCP1.

In accordance with an embodiment, a hole H for forming a contact part CNP may be formed in the third insulating layer INS3 as a subsequent process is performed. For example, the third insulating layer INS3 may include the hole H exposing at least a portion of the first conductive connection pattern layer CCP1. The hole H may include a space in which at least a portion of a second conductive connection pattern layer CCP2 and the first conductive connection pattern layer CCP1 are connected (e.g., electrically connected) to each other as a subsequent process is performed.

Referring to FIGS. 16 and 24 to 26, in the phase (or step) S400 of disposing the second conductive connection pattern layer, a second conductive connection pattern layer CCP2 may be patterned on the base layer BSL. For example, a second connection electrode ELT2, a fourth connection electrode ELT4, and conductive pattern layers CP may be formed (or patterned) on the base layer BSL. For convenience of description, a second conductive pattern layer CP2 among the conductive pattern layers CP will be described.

In the phase (or step) S400, at least a portion of the second conductive connection pattern layer CCP2 may be disposed on the first insulating layer INS1, and at least another portion of the second conductive connection pattern layer CCP2 may be disposed on the light emitting elements LD. For example, a portion of the second connection electrode ELT2 may be disposed on a second end portion EP2 of the first light emitting element LD1 and the first insulating layer INS1 over the second electrode ALE2. Another portion of the second connection electrode ELT2 may be disposed on a first end portion EP1 of the second light emitting element LD2 and the first insulating layer INS1 over the first electrode ALE1. A portion of the fourth connection electrode ELT4 may be disposed on a second end portion EP2 of a third light emitting element LD3 and the first insulating layer INS1 over the third electrode ALE3. Another portion of the fourth connection electrode ELT4 may be disposed on a first end portion EP1 of the fourth light emitting element LD4 and the first insulating layer INS1 over the fourth electrode ALE4.

In the phase (or step) S400, at least a portion of the second conductive connection pattern layer CCP2 may be disposed on the first conductive connection pattern layer CCP1. For example, the second conductive pattern layer CP2 may be disposed on the first conductive connection pattern layer CCP1 (e.g., the third connection electrode ELT3).

In accordance with an embodiment, the second conductive connection pattern layer CCP2 may be disposed, and the hole H may be filled with a conductive material. Accordingly, the second conductive pattern layer CP2 may be connected (e.g., electrically connected) to the first conductive connection pattern layer CCP1 (e.g., the third connection electrode ELT3) through the contact part CNP.

Figure 25:
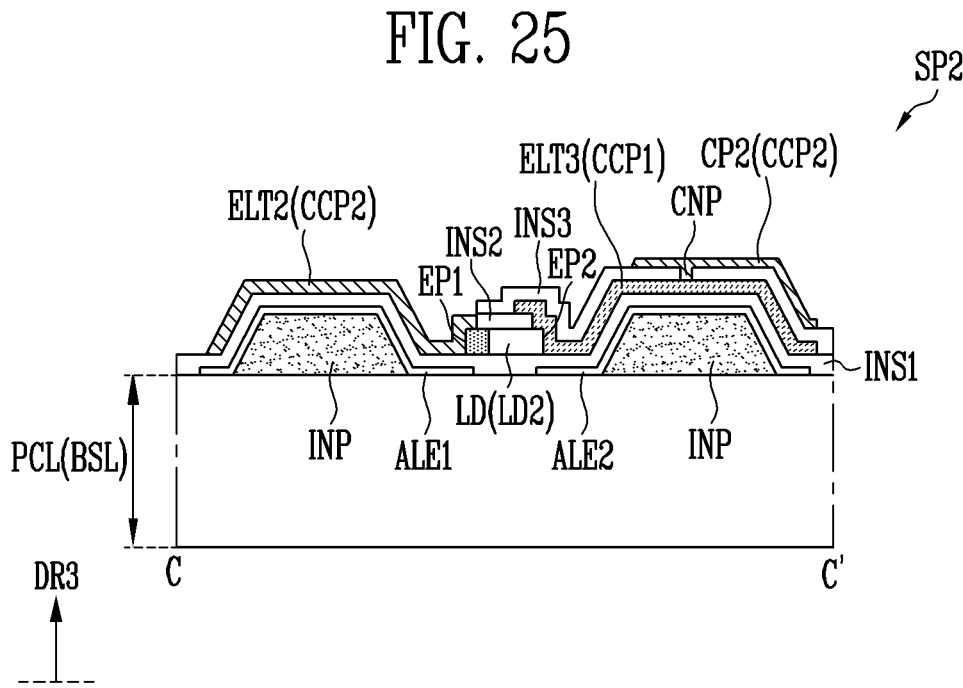

In accordance with an embodiment, after the second conductive connection pattern layer CCP2 is patterned, the light emitting elements LD may be connected (e.g., electrically connected) to the first conductive connection pattern layer CCP1 and the second conductive connection pattern layer CCP2 in each of the serial parts SP, and accordingly, connection electrodes ELT and light emitting elements LD of each of the serial parts SP may be connected (e.g., electrically connected) to each other (FIG. 25). However, in one or more embodiments, in case that light emitting elements LD are abnormally disposed in some (e.g., the second serial part SP2) of the serial parts SP, connection electrodes ELT may not be connected (e.g., electrically connected) to each other before/after an area in which the light emitting elements LD are to be disposed (FIG. 26). In order to define an electrical path defined by the light emitting elements LD and the connection electrodes ELT of each of the serial parts SP, it is necessary to repair a defect of the electrical path.

Figure 28:
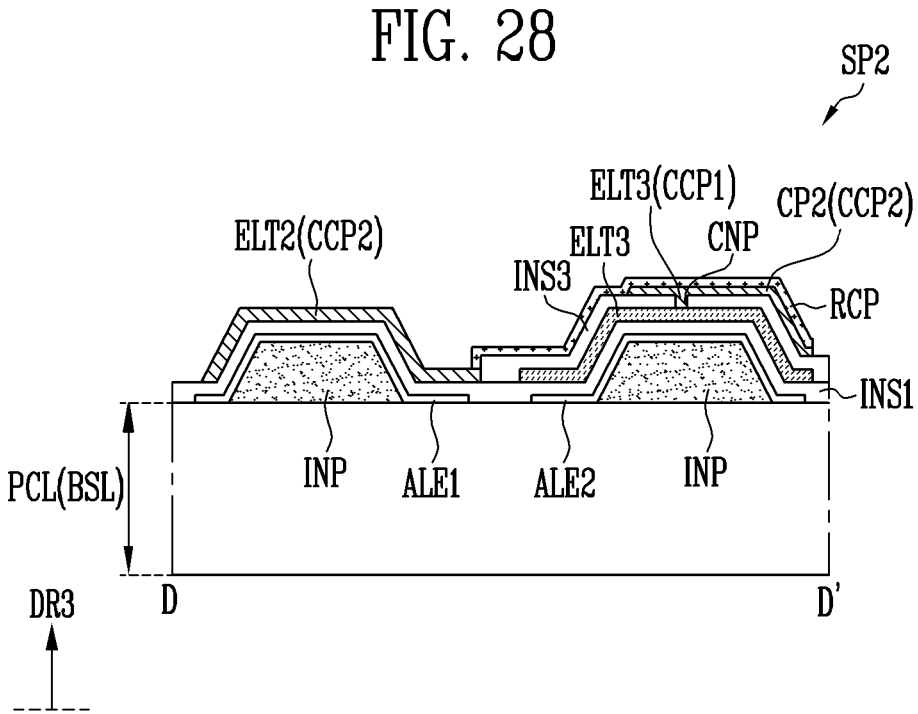

Referring to FIGS. 16, 27, and 28, in the phase (or step) S500 of performing the repair process, a defect of an electrical path may be repaired. For example, in the phase (or step) S500, a repair conductive pattern layer RCP for performing the repair process may be patterned. In one or more embodiments, the phase (or step) S500 of performing the repair process may include phase (or step) S520 of determining whether connection electrodes have been connected (e.g., electrically connected) to each other in a serial part and phase (or step) S540 of disposing a repair conductive pattern layer RCP in at least some of the serial parts.

In the phase (or step) S520 of determining whether the connection electrodes have been connected (e.g., electrically connected) to each other in the serial part, some in which connection electrodes ELT are not electrically connected to each other (e.g., are electrically separated from each other) among the serial parts SP may be checked (or determined). For example, light emitting elements LD may be abnormally disposed in the second serial part SP2, so that connection electrodes ELT (e.g., the second connection electrode ELT2 and the third connection electrode ELT3) may not be electrically connected to each other. An electrical path between the second connection electrode ELT2 and the third connection electrode ELT3 may be blocked, so that the serial parts SP may not be electrically connected to each other.

In the phase (or step) S540 of disposing the repair conductive pattern layer RCP in the at least some of the serial parts, the connection electrodes ELT in the second serial part SP2 determined an abnormal area may be connected (e.g., electrically connected) to each other. For example, in the phase (or step) S540, the repair conductive pattern layer RCP may be patterned to electrically connect the connection electrodes ELT in the second serial part SP2. A portion of the repair conductive pattern layer RCP may be connected (e.g., electrically connected) to the second connection electrode ELT2, and another portion of the repair conductive pattern layer RCP may be connected (e.g., electrically connected) to the conductive pattern layer CP. Thus, the connection electrodes ELT in the second serial part SP2 may be repaired to be connected (e.g., electrically connected) to each other. Accordingly, the serial parts SP may be normally connected to each other.

In accordance with an embodiment, the connection electrodes ELT to which the portion and the another portion of the repair conductive pattern layer RCP are respectively connected respectively may correspond to a layer included in the second conductive connection pattern layer CCP2. As described above, target electrodes, which are connected (e.g., electrically connected) so as to perform the repair process, may be disposed in (or formed as) a same layer, and hence the reliability of the repair process may be substantially ensured. In case that an ink is used to form the repair conductive pattern layer RCP, the reliability of the repair process may be further improved. For example, in case that the ink connects (e.g., electrically connects) conductive pattern layers disposed in different layers, at least some may not be electrically suitably connected to each other. It may be difficult to reconsider the reliability of the repair process. However, in accordance with an embodiment, in case that the ink is used, the ink may connect (e.g., electrically connect) conductive connection pattern layers CCP1 and CCP2, which are included in a same layer or are formed of a same material, and hence the repair process may be suitably performed. Consequently, a defect rate of the pixel PXL may be remarkably lowered. Accordingly, a conventional problem that some of pixels PXL are viewed as dark spots may be solved.

For example, the conductive pattern layer CP for electrically connecting the repair conductive pattern layer RCP corresponds to a layer included in the first conductive connection pattern layer CCP1, and any separate process is not additionally required. Hence, additional process cost may not be substantially required. For example, experimentally, in case that the conductive pattern layer CP is not disposed, it is necessary to perform a laser process for forming an area penetrating at least a portion of the third insulating layer INS3 covering the first conductive connection pattern layer CCP1 such that a conductive ink may connect (e.g., electrically connect) the connection electrodes to each other. However, in accordance with an embodiment, the laser process may not be required.

For convenience of description, an embodiment, in which the repair process is performed on the second serial part SP2, is described. However, embodiments are not limited thereto. For example, the number of serial parts SP may be changed, and the repair process may be performed on two or more serial parts SP.

In accordance with the disclosure, a reliability of a repair process may be improved, light emitting elements may be normally operated.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with an embodiment may be used singly or in combination with features, characteristics, and/or elements described in connection with other embodiments unless otherwise specifically indicated. Accordingly, it will be understood by those of skill in the art that various changes in form and details may be made without departing from the features and scope of the disclosure as set forth in the following claims.

What is claimed is:

1. A display device comprising:
alignment electrodes disposed on a base layer, the alignment electrodes being spaced apart from each other;
a light emitting element disposed on the alignment electrodes;
a first conductive connection pattern layer including a first connection electrode electrically connected to the light emitting element, at least a portion of the first conductive connection pattern layer disposed on the alignment electrodes; and
a second conductive connection pattern layer including a second connection electrode electrically connected to the light emitting element and a conductive pattern layer disposed on the first conductive connection pattern layer, at least a portion of the second conductive connection pattern layer disposed on the alignment electrodes, wherein
the conductive pattern layer is electrically connected to the first conductive connection pattern layer,
the conductive pattern layer is disposed at a higher level than the first conductive connection pattern layer, with respect to the base layer.

2. The display device of claim 1, further comprising:
serial parts including a first serial part and a second serial part that are electrically connected to each other, each of the first serial part and the second serial part including the light emitting element; and
a first power source and a second power source that supply different power sources to the serial parts, wherein
the serial parts are electrically connected between the first power source and the second power source,
the first conductive connection pattern layer further includes a third connection electrode,
the light emitting element of the first serial part electrically connects the first connection electrode and a first portion of the second connection electrode to each other, and
the light emitting element of the second serial part electrically connects a second portion of the second connection electrode and the third connection electrode to each other.

3. The display device of claim 1, wherein
the conductive pattern layer and the second conductive connection pattern layer includes a same material, and
the conductive pattern layer and the first conductive connection pattern layer are disposed on different layers, respectively.

4. The display device of claim 2, wherein the conductive pattern layer is included in each of the serial parts.

5. The display device of claim 2, wherein the second conductive connection pattern layer includes a bridge that connects a first portion of the second connection electrode included in the first serial part and a second portion of the second connection electrode included in the second serial part, the conductive pattern layer includes a first conductive pattern layer included in the first serial part and a second conductive pattern layer included in the second serial part, the first conductive pattern layer is adjacent to a first side of the bridge, and the second conductive pattern layer is adjacent to a second side of the bridge.

6. The display device of claim 5, wherein the alignment electrodes are spaced apart from each other in a first direction, and the first conductive pattern layer and the second conductive pattern layer do not overlap the light emitting element in the first direction.

7. The display device of claim 1, wherein the conductive pattern layer is electrically connected to the first conductive connection pattern layer, which overlaps the conductive pattern layer in a plan view, through a contact part penetrating an insulating layer between the conductive pattern layer and the first conductive connection pattern layer.

8. The display device of claim 1, further comprising:

serial parts including a first serial part and a second serial part that are electrically connected to each other;

a first power source and a second power source that supply different power sources to the serial parts; and a repair conductive pattern layer included in the second serial part, wherein the serial parts are electrically connected between the first power source and the second power source, the conductive pattern layer includes a first conductive pattern layer included in the first serial part and a second conductive pattern layer included in the second serial part, the first conductive connection pattern layer further includes a third connection electrode, the light emitting element of the first serial part electrically connects the first connection electrode and a first portion of the second connection electrode to each other, and the repair conductive pattern layer electrically connects a second portion of the second connection electrode and the second conductive pattern layer to each other in the second serial part.

9. The display device of claim 8, wherein the repair conductive pattern layer overlaps the second conductive pattern layer in a plan view.

10. The display device of claim 8, wherein the light emitting element does not electrically connect the second connection electrode and the third connection electrode in the second serial part.

11. The display device of claim 8, wherein the repair conductive pattern layer includes a conductive ink.

12. The display device of claim 1, further comprising a first serial part, a second serial part, a third serial part, and a fourth serial part that are electrically connected to each other, each of the first serial part, the second serial part, the third serial part, and the fourth serial part including the light emitting element, wherein the first conductive connection pattern layer further includes a third connection electrode and a fifth connection electrode, the second conductive connection pattern layer further includes a fourth connection electrode, the light emitting element includes a first light emitting element included in the first serial part, a second light emitting element in the second serial part, a third light emitting element in the third serial part, and a fourth light emitting element in the fourth serial part, and the first connection electrode, the first light emitting element, the second connection electrode, the second light emitting element, the third connection electrode, the third light emitting element, the fourth connection electrode, the fourth light emitting element, and the fifth connection electrode are sequentially electrically connected to each other.

13. A method for manufacturing a display device, the method comprising:

disposing alignment electrodes on a base layer;

disposing a light emitting element on the alignment electrodes in serial parts on the base layer;

disposing a first conductive connection pattern layer on the base layer;

disposing a second conductive connection pattern layer on the base layer; and performing a repair process on the serial parts, wherein the disposing of the second conductive connection pattern layer includes disposing a conductive pattern layer on at least a portion of the first conductive connection pattern layer, each of the first conductive connection pattern layer and the second conductive connection pattern layer includes connection electrodes spaced apart from each other with an area, in which the light emitting element is disposed, in each of the serial parts, the serial parts include a first serial part and a second serial part, and the performing of the repair process includes:

determining whether the connection electrode of the first conductive connection pattern layer and the connection electrode of the second conductive connection pattern layer are electrically connected to each other in each of the serial parts; and disposing a repair conductive pattern layer on the conductive pattern layer in the second serial part in which the connection electrode of the first conductive connection pattern layer and the connection electrode of the second conductive connection pattern layer are not electrically connected to each other.

14. The method of claim 13, wherein each of the connection electrodes includes:

a first connection electrode included in the first serial part and a third connection electrode including at least a portion in the second serial part, the first connection electrode and the third connection electrode included in the first conductive connection pattern layer; and a second connection electrode including a first portion included in the first serial part and a second portion included in the second serial part, the second connection electrode included in the second conductive connection pattern layer, and the disposing of the second conductive connection pattern layer is performed after the disposing of the first conductive connection pattern layer.

15. The method of claim 14, wherein the determining whether a connection electrode of the first conductive connection pattern layer and a connection electrode of the second conductive connection pattern layer are electrically connected to each other includes checking whether the light emitting element electrically connects the connection electrodes to each other.

16. The method of claim 13, wherein the repair conductive pattern layer electrically connects a first portion of the second conductive connection pattern layer and a second portion of the second conductive connection pattern layer to each other.

17. The method of claim 13, wherein the repair conductive pattern layer includes a conductive ink.

18. The method of claim 13, further comprising disposing an insulating layer between the first conductive connection pattern layer and the second conductive connection pattern layer, wherein the disposing of the insulating layer includes forming a hole exposing at least a portion of the first conductive connection pattern layer in a plan view.

19. An electronic device comprising:

alignment electrodes disposed on a base layer, the alignment electrodes being spaced apart from each other;

a light emitting element disposed on the alignment electrodes;

a first conductive connection pattern layer including a first connection electrode electrically connected to the light emitting element, at least a portion of the first conductive connection pattern layer disposed on the alignment electrodes;

a second conductive connection pattern layer including a second connection electrode electrically connected to the light emitting element and a conductive pattern layer disposed on the first conductive connection pattern layer, at least a portion of the second conductive connection pattern layer disposed on the alignment electrodes;

serial parts including a first serial part and a second serial part that are electrically connected to each other;

a first power source and a second power source that supply different power sources to the serial parts; and a repair conductive pattern layer included in the second serial part, wherein the conductive pattern layer is electrically connected to the first conductive connection pattern layer, and the conductive pattern layer is disposed at a higher level than the first conductive connection pattern layer, with respect to the base layer.

* * * * *